United States Patent
Noguchi et al.

(10) Patent No.: US 6,897,956 B2
(45) Date of Patent: May 24, 2005

(54) APPARATUS AND METHOD FOR MEASURING ALIGNMENT ACCURACY, AS WELL AS METHOD AND SYSTEM FOR MANUFACTURING SEMICONDUCTOR DEVICE

(75) Inventors: Minori Noguchi, Mitsukaido (JP); Masahiko Nakada, Okegawa (JP); Takahiko Suzuki, Honjou (JP); Taketo Ueno, Fujisawa (JP); Toshihiko Nakata, Hiratsuka (JP); Shunji Maeda, Yokohama (JP)

(73) Assignees: Hitachi, Ltd., Tokyo (JP); Hitachi High-Tech Electronics Engineering Co., Ltd., Tokyo (JP)

(*) Notice: Subject to any disclaimer, the term of this patent is extended or adjusted under 35 U.S.C. 154(b) by 435 days.

(21) Appl. No.: 10/235,656

(22) Filed: Sep. 6, 2002

(65) Prior Publication Data

US 2003/0160960 A1 Aug. 28, 2003

(30) Foreign Application Priority Data

Feb. 25, 2002 (JP) ........................................ 2002-047852

(51) Int. Cl.⁷ .............................................. G01B 11/00
(52) U.S. Cl. .................................... 356/401; 356/400
(58) Field of Search ............................... 356/400–401; 430/5, 22, 30; 355/53, 55

(56) References Cited

U.S. PATENT DOCUMENTS 6,088,113 A * 7/2000 Kim ........................... 356/401
6,331,885 B1 * 12/2001 Nishi ......................... 356/401

* cited by examiner

*Primary Examiner*—Zandra V. Smith
(74) *Attorney, Agent, or Firm*—Antonelli, Terry, Stout & Kraus, LLP

(57) ABSTRACT

An apparatus for measuring an alignment accuracy between overlaid alignment marks formed to each of alignment mark portions on every plural chip units or exposure units arranged on a substrate to be measured, comprising: an XY stage running in a direction x and in a direction y while mounting the substrate; an illumination optical system for illuminating each of the alignment mark portions in a state where the XY stage runs in a direction x which is a direction of arranging the chips; a detecting optical system having an objective lens for collecting a reflection light in the running state obtained from the overlaid alignment marks, a focusing optical system for focusing the reflection light in the running state obtained from the objective lens, a scanning optical system for scanning reflection light image in the running state focused by the focusing optical system in a direction opposite to that of the running and a linear image sensor receiving reflection light image substantially in a static state being scanned in the opposite direction by the scanning optical system and converting them into image signal; and an alignment accuracy calculation device for measuring the alignment accuracy between the overlaid alignment marks at least for a direction perpendicular to the running direction based on the image signal converted by the linear image sensor.

21 Claims, 24 Drawing Sheets

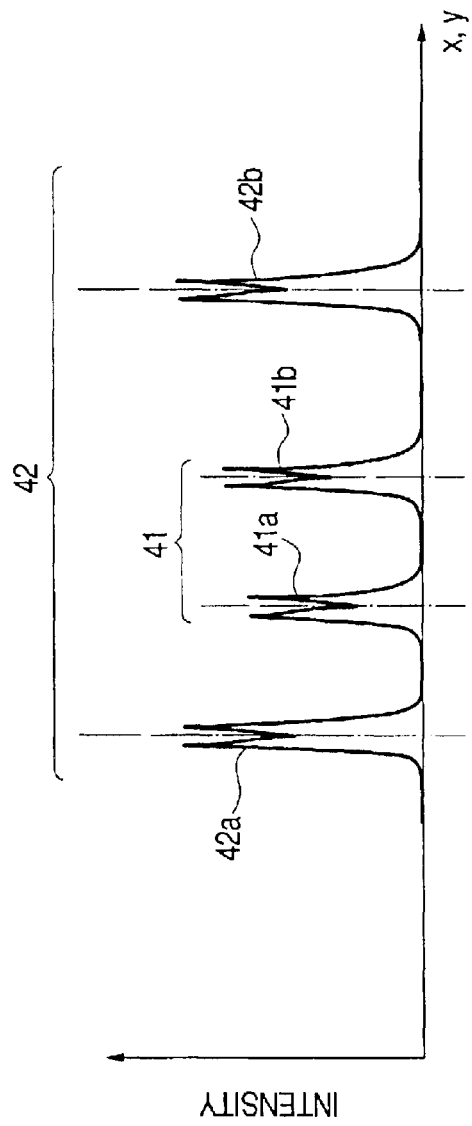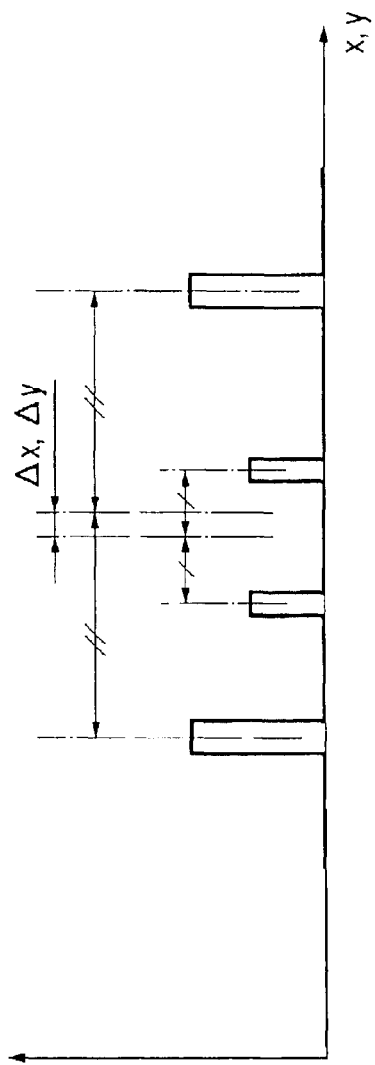

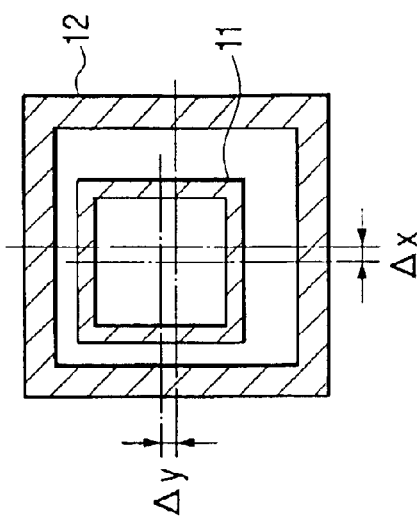
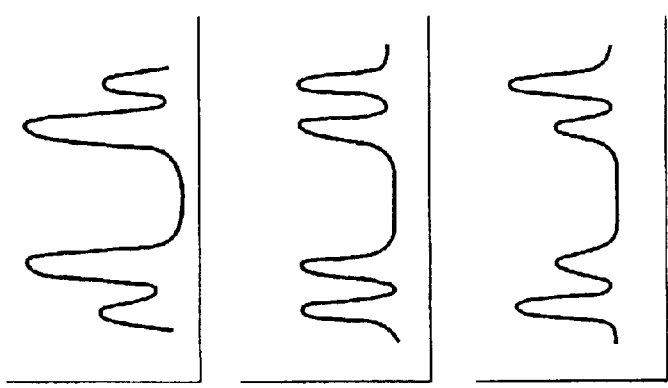
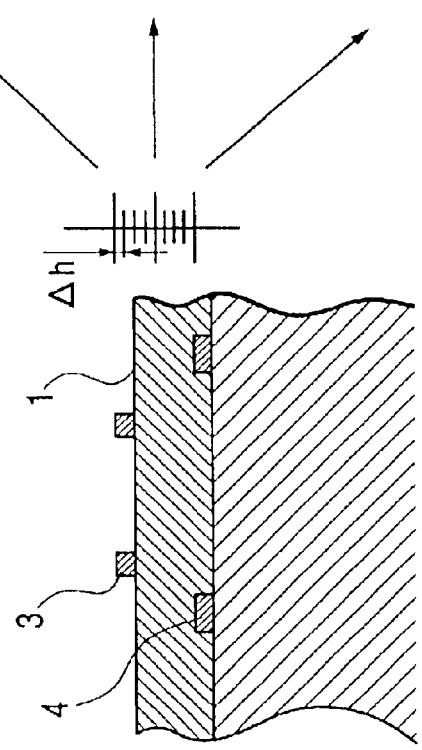

APPARATUS AND METHOD FOR MEASURING ALIGNMENT ACCURACY, AS WELL AS METHOD AND SYSTEM FOR MANUFACTURING SEMICONDUCTOR DEVICE

BACKGROUD OF THE INVENTION

This invention concerns an apparatus and a method of measuring alignment accuracy (overlay accuracy) for measuring failures such as misalignment or defocusing occurring upon exposure and etching of patterns in a production step of producing aimed substrates by forming circuit patterns on substrates such as semiconductor manufacturing steps, liquid crystal display device manufacturing steps and manufacturing steps of a printed circuit board, as well as a method of manufacturing semiconductor devices for producing semiconductor devices by analyzing misalignment or the like and adopting countermeasure therefor, as well as a system thereof.

Heretofore, for producing semiconductor devices, thickness of deposition films, dimension after exposure or after etching or misalignment with lower layer patterns were measured on every production steps for semiconductor devices and process conditions were set such that they were within predetermined ranges.

In this case, when deposition films or etching patterns formed on a semiconductor substrate (wafer) are not within a predetermined range, failure rate of semiconductor chips in the wafer is increased to deteriorate the yield of semiconductors (ratio for good products).

Thickness of the deposition film or the size of the pattern upon exposure and the etching exceeds the predetermined range by fluctuation of various process conditions such as pressure of reaction gas, temperature of substrate supports, voltage applied upon plasma generation, intrusion of impurities into the process gas, focal position upon exposure and overlay level upon exposure, or erroneous manual input of the process conditions.

Also in similar production steps for liquid crystal display devices, when process conditions such as pressure of reaction gas and overlay level upon exposure fluctuate, manufactured products can not be used as display devices. The situation is also identical in the manufacturing steps of printed circuit boards in which fluctuation of process conditions causes short and connection failure of circuit patterns.

As one of methods of measuring alignment accuracy for semiconductor substrates of this type, a method of measuring misalignment of alignment marks on a semiconductor substrate by irradiating light onto semiconductor substrate and producing semiconductors while changing the process parameters if they are not within a predetermined range has been described in Japanese Patent Laid-Open No. H10-2533250.

In the prior art described above, misalignment for three chips, five chips or nine chips in a wafer is measured but the subject of the measuring distribution of the misalignment within the wafer has not been recognized. Accordingly, there is no concept of measuring the distribution of the misalignment in a wafer and, therefore, it has not yet been attained.

Further, introduction of CMP (Chemical Mechanical Polishing) step or the like to the manufacturing steps for semiconductor devices results in a problem that the contrast of images for alignment mark is low, making the measurement for the misalignment difficult. The prior art described above has a subject that measurement for misalignment does difficult by the detection of images having at low contrast from the alignment mark.

SUMMARY OF THE INVENTION

An object of this invention intends to provide, in view of the subject described above, an apparatus and a method of measuring alignment accuracy (overlay accuracy) capable of measuring alignment accuracy at a high throughput for plural alignment marks.

A further object of this invention intends to provide a method of manufacturing a semiconductor device as well as a system thereof capable of improving the accuracy for analyzing fluctuation factors of the alignment accuracy (the overlay accuracy) being caused by strange differences between the processes, by calculating the distribution of alignment accuracy at more points within a wafer.

The basic object of this invention of detecting the process failure can be attained by measuring alignment accuracy (overlay accuracy) for plural chips in a wafer and recognizing the distribution of alignment accuracy in the wafer.

Further, measurement of the alignment accuracy for a number of chips in a wafer as the object of this invention can be attained by measuring with a measuring device at high throughput comprising one of a high speed scanning device by a high speed stage, an image capturing device during running of the stage and a signal intake device at high speed.

Further, measurement for the alignment accuracy of alignment marks (overlaid alignment marks) at low contrast as the object of this invention can be attained by a dark view field illumination device and a dark view field image capturing device.

Further, setting for the control value of the alignment accuracy as the object of this invention can be attained with a device (unit) for measuring alignment accuracy for a number of chips, a final electrical inspection device (a probe inspection device) for the chips and a data processing device for processing data from the electrical inspection device and the alignment accuracy measuring device.

Further, control for the process conditions as an object of this invention can not always be attained only by measurement at high accuracy but attained by monitoring the fluctuation of the process variations. More specifically, it can be attained by measuring the alignment accuracy of alignment marks (overlay marks) on a substrate formed with circuit patterns by exposure and development, calculating the distribution of the alignment accuracy that fluctuates by the variation of the process conditions in the wafer and monitoring the fluctuation within the wafer or between the wafers.

Further, control for the process conditions as an object of this invention can not always be attained only by measurement at high accuracy but attained by monitoring the fluctuation of the process variations. More specifically, it can be attained by measuring the alignment accuracy of alignment marks on a substrate formed with circuit patterns by exposure and development, calculating the dispersion of the alignment accuracy that fluctuates by the variation of the process conditions over group of chips within the wafer and monitoring the fluctuation within the wafer or between the wafers.

This invention provides an apparatus for measuring an alignment accuracy between alignment marks formed to each of alignment mark portions on every plural chip units or exposure units arranged on a substrate to be measured, comprising an XY stage running in a direction x and in a direction y while mounting the substrate, an illumination optical system for illuminating each of the alignment mark portions in a state where the XY stage runs in a direction x which is a direction of arranging the chips, a detecting optical system having an objective lens for collecting a reflection light in the running state obtained from the overlaid alignment marks (the overlay marks) irradiated by the illumination optical system, a focusing optical system for focusing the reflection light in the running state obtained by collecting light from the objective lens, a scanning optical system for scanning reflection light image in the running state focused by the focusing optical system in a direction opposite to that of the running and a linear image sensor receiving reflection light image substantially in a static state (also including a case of decreasing generally as well as the static state) being scanned in the opposite direction by the scanning optical system and converting them into image signal, and an alignment accuracy calculation device for measuring the alignment accuracy between the overlaid alignment marks at least for a direction perpendicular to the running direction based on the image signal converted by the linear image sensor of the detecting optical system.

Further, in a preferred embodiment of the apparatus for measuring alignment accuracy according to this invention, the linear image sensor of the detecting optical system comprises a 2-dimensional image sensor. Further, in another embodiment of the apparatus for measuring alignment accuracy according to this invention, the linear image sensor of the detecting optical system comprises a TDI image sensor. In a further embodiment of the apparatus for measuring alignment accuracy according to this invention, the linear image sensor of the detecting optical system comprises plural channels. In a further embodiment of the apparatus for measuring alignment accuracy according to this invention, the illumination optical system is constituted for vertical illumination through the objective lens. In a further embodiment of the apparatus for measuring alignment accuracy according to this invention, illumination optical system has an optical source filter forming a secondary optical source. In a further embodiment of the apparatus for measuring alignment accuracy according to this invention, the detecting optical system has a focusing filter for shutting or decreasing 0-order diffraction reflection light obtained from the alignment mark portions.

Further, this invention provides an apparatus for measuring an alignment accuracy between overlaid alignment marks formed to each of alignment mark portions on every plural chip units or exposure units arranged on a substrate to be measured, comprising an XY stage running in a direction x and in a direction y while mounting the substrate, an illumination optical system for illuminating first alignment mark portion in a state where the XY stage runs in the direction x which is direction of arranging the chips and for illuminating second alignment mark portion in a static state, a detecting optical system having an objective lens for collecting first reflection light in the running state and second reflection light in the static state obtained from overlaid alignment marks of each of the first and second alignment mark portions irradiated by the illumination optical system, a focusing optical system for focusing the first reflection light in the running state and the second reflection light in the static state obtained by collecting light from the objective lens, a switching optical system for switching the first reflection light in the running state and the second reflection light in the static state obtained by collecting light from the objective lens, a scanning optical system for scanning first reflection light image in the running state being switched by the switching optical system and focused by the focusing optical system and scanning the same in the direction opposite to said scanning direction, a first linear image sensor (image sensor of measuring speed preference type) receiving first reflection light image substantially in a static state being scanned in the opposite direction by the scanning optical system and converting the same into first image signal, and a second linear image sensor (image sensor of measuring speed preference type) for receiving second reflection light image in the static state being switched by the switching optical system and focused by the focusing optical system and converting the same into second image signal, and a calculation device for alignment accuracy for measuring a first alignment accuracy between the overlaid alignment marks of the first alignment mark portion at least in a direction perpendicular to the running direction based on the first image signal converted by the first linear image sensor and measuring a second alignment accuracy between the overlaid alignment marks of the second alignment mark portion based on the second image signal converted by the second linear image sensor. That is this invention has a feature of switching the measuring speed preference mode and the measuring accuracy preference mode.

In a further embodiment of the apparatus for measuring the alignment accuracy according to this invention, the switching optical system in the detecting optical system is constituted with a branching optical system. Further, in another preferred embodiment of the apparatus for measuring the alignment accuracy according to this invention, the switching optical system in the detecting optical system is constituted by advancing and retracting the scanning optical system in the detecting optical system. In a further preferred embodiment of the apparatus for measuring the alignment accuracy according to this invention, the second linear image sensor in the detecting optical system comprises a 2-dimensional image sensor. In a further preferred embodiment of the apparatus for measuring the alignment accuracy according to this invention, the second linear image sensor in the detecting optical system comprises a TDI image sensor. In a further preferred embodiment of the apparatus for measuring the alignment accuracy according to this invention, the second linear image sensor in the detecting optical system comprises plural channels.

Further, this invention provides an apparatus for measuring alignment accuracy between overlaid alignment marks (overlay marks) formed to each of alignment mark portions on every plural chip units or exposure units arranged on a substrate to be measured, comprising an XY stage running in a direction x and in a direction y while mounting the substrate, an illumination optical system for illuminating the alignment mark portion, a detecting optical system having an objective lens for collecting reflection light obtained from the overlaid alignment marks on each of the alignment mark portions illuminated by the illumination optical system, a branching optical system for branching reflection light obtained by collection from the objective lens, a focusing optical system for focusing first and second reflection lights branched in the branching optical system, a 1-dimensional linear image sensor for receiving first reflection light image branched by the branching optical system and focused by the focusing optical system and converting the same into focus image signal and a 2-dimensional linear image sensor for receiving second reflection light image branched in the branching optical system and focused in the focusing optical system and converting the same into 2-dimensional image signal for detecting misalignment, a focus control device for controlling the focused state of the substrate to be measured relative to the optical lens to an optimal state based on the focus image signal converted in the 1-dimensional linear sensor of the detecting optical system, and an accuracy calculation device for measuring the alignment accuracy between the overlaid alignment marks based on the 2-dimensional image signal obtained from the 2-dimensional image sensor in the detecting optical system when the focused state is optimized by the focus control device.

Further, this invention provides a method of measuring alignment accuracy between overlaid alignment marks formed to each of alignment mark portions on every plural chip units or exposure units arranged on a substrate to be measured, comprising;

an illumination step of illuminating each of the alignment mark portions by an illumination optical system in a state while running the XY stage that runs in a direction x and in a direction y while mounting the substrate in direction x which is direction of arranging the chips, a detection step of collecting a reflection light in the running state obtained from alignment mark of the lower layer and alignment mark of the upper layer from the illuminated alignment mark portion by an objective lens, focusing the reflection light in the running state obtained by collecting light by a focusing optical system, scanning the focused reflection light image in the running state focused by a scanning system in a direction opposite to that of the running and receiving the reflection light image substantially in a static state being scanned in the opposite direction by a linear image sensor and converting the same into image signal, and an alignment accuracy calculation step of measuring the alignment accuracy between the overlaid alignment marks at least for a direction perpendicular to the running direction based on the image signals obtained from the linear image sensor.

Further, this invention provides a system for producing a semiconductor device including, an exposure/development device of coating a resist to a substrate to be measured, arranging circuit patterns also including alignment marks on the exposure units successively to the substrate to be measured coated with the resist, exposing the same and then developing the substrate to be measured arranged and exposed successively to remove the resist pattern, an alignment accuracy measuring device of measuring alignment accuracy between overlaid alignment marks formed to each of the alignment mark portions on every plural chip units or exposure units arranged on a substrate to be measured by the exposure/development device, and a control section for calculating alignment accuracy decomposed into error components based on the alignment accuracy between the alignment mark of the lower layer and the alignment marks of the upper layer formed to the alignment mark portions on every plural chip units or exposure units measured by the alignment accuracy measuring device on the substrate units or lot units, setting an accuracy reference value $\delta_0'$ on every error components at which the degree of effect on the yield is started to be decreased on the substrate units or the lot units, and controlling the alignment accuracy to the exposure/development device by the progress of the number for chip units or the number for the exposure units in which the calculated alignment accuracy $\delta$ on every error components exceeds the alignment accuracy reference value $\delta_0$ set on every error components.

Further, this invention provides a method of manufacturing a semiconductor device comprising an exposure/development step of coating a resist to a substrate to be measured, successively arranging and exposing circuit patterns also including the alignment marks on exposure units to the substrate to be measured coated with the resist and developing the substrate to be measured which have been arranged and exposed successively to remove the resist pattern, an alignment accuracy measuring step of measuring the alignment accuracy on every plural chip units or exposure units arranged on the substrate to be measured by the exposure/development step between the alignment mark of the lower layer and the alignment mark of the upper layer formed to each of the alignment mark portions, and a control step of calculating alignment accuracy decomposed into error components based on the alignment accuracy between the alignment mark of the lower layer and the alignment mark of the upper layer formed to each of the alignment mark portions on every plural chip units or exposure units measured by the alignment accuracy measuring step, setting an alignment accuracy reference value $\delta_0'$ on every error components at which degree of effect $\Delta Y$ on yield is started to be decreased on substrate units or lot units, and controlling the alignment accuracy to the exposure/development device depending on progress of number for chip units or number for exposure units in which the calculated alignment accuracy $\delta$ on every error components exceeds alignment accuracy reference value $\delta_0$ set on every error components.

Further, in a preferred embodiment according to this invention, the degree of effect $\Delta Y$ on the yield in the control step is calculated based on result of checking judgment in an operation test on the chip units or on the exposure units.

BRIEF DESCRIPTION OF THE DRAWINGS

FIG. 1 is a view showing an example of a pattern of a measured object according to this invention in which

FIG. 13 is an explanatory view for an image signal waveform obtained from one line of a 2-dimensional sensor shown in FIG. 12 and for calculating misalignment based on the image signal;

FIG. 24 is a view for explaining a state of imaging a pattern to be measured by calculating an optimal focus position based on image signals detected from a 1-dimensional sensor and setting the pattern static in a state of stopping an X-stage at the optimal focus position by a 2-dimensional sensor (detector) in the fourth embodiment;

DETAILED DESCRIPTION OF PREFERRED EMBODIMENT

An apparatus and a method for measuring alignment accuracy (overlay accuracy) according to this invention and a system embodying them are to be described with reference to FIG. 1 to FIG. 10.

Main items to be controlled in the exposure apparatus such as a projection aligner include, for example, overlay error with lower layer (alignment error such as magnification ratio error, rotational error and shifting error), focusing error and exposure amount.

Figure 1A:
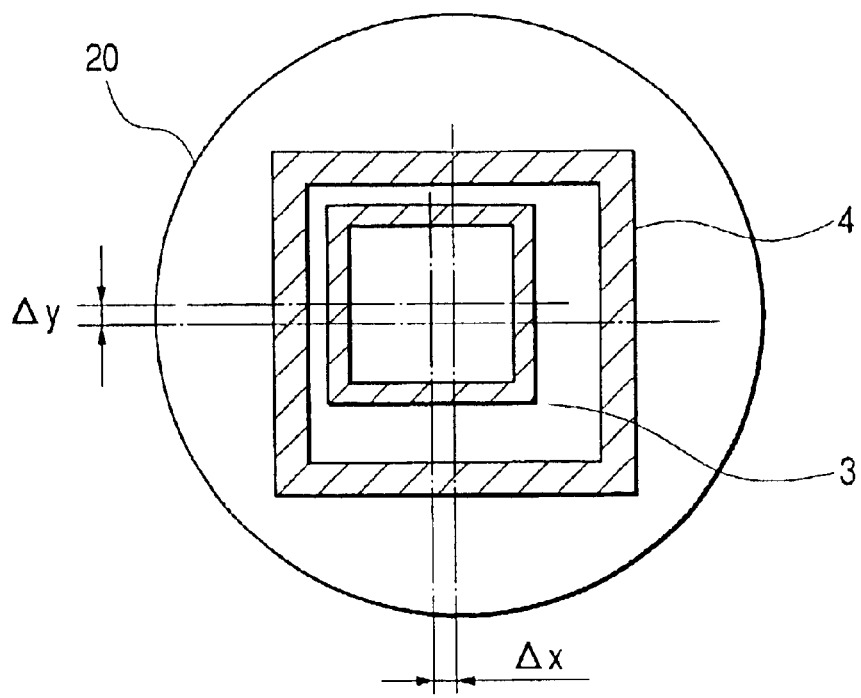
FIG. 1A is a plan view and FIG. 1B is a side elevational cross sectional view.
Figure 1B:
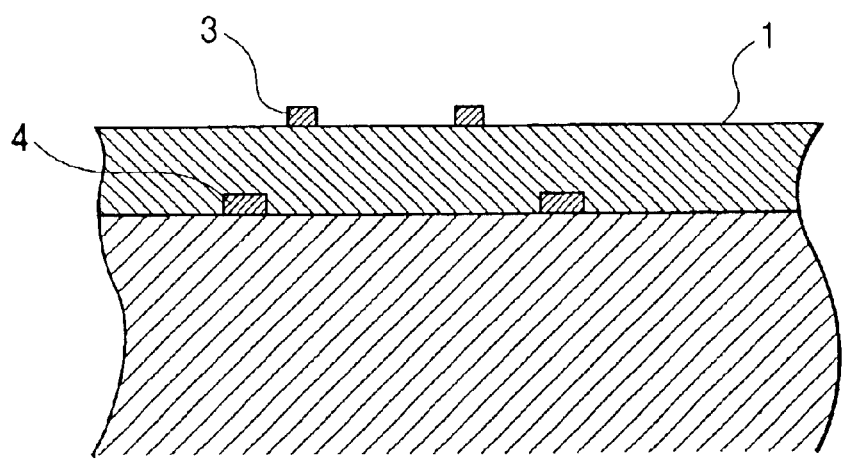

This invention concerns an apparatus for measuring alignment accuracy which measures an alignment accuracy (an overlay accuracy) between alignment marks 4, for example, of a square frame formed to a lower layer and alignment marks 3, for example, of a square frame formed to an upper layer (alignment accuracy in exposure apparatus) (deviation $\Delta x$ in direction x and $\Delta y$ in direction y) as shown in FIG. 1, as well as a system therefor. Reference 20 denotes a view field of an objective lens 301 in an apparatus for measuring alignment accuracy. Both of the alignment marks 4 and the alignment marks 3 are formed in the shape of a square frame to have a linear component in the direction x and in the direction y such that alignment in the direction x and the direction y can be measured accurately. In a case shown in FIG. 1, the size for the alignment mark 4 is made larger than the size for the alignment mark 3.

Figure 2:
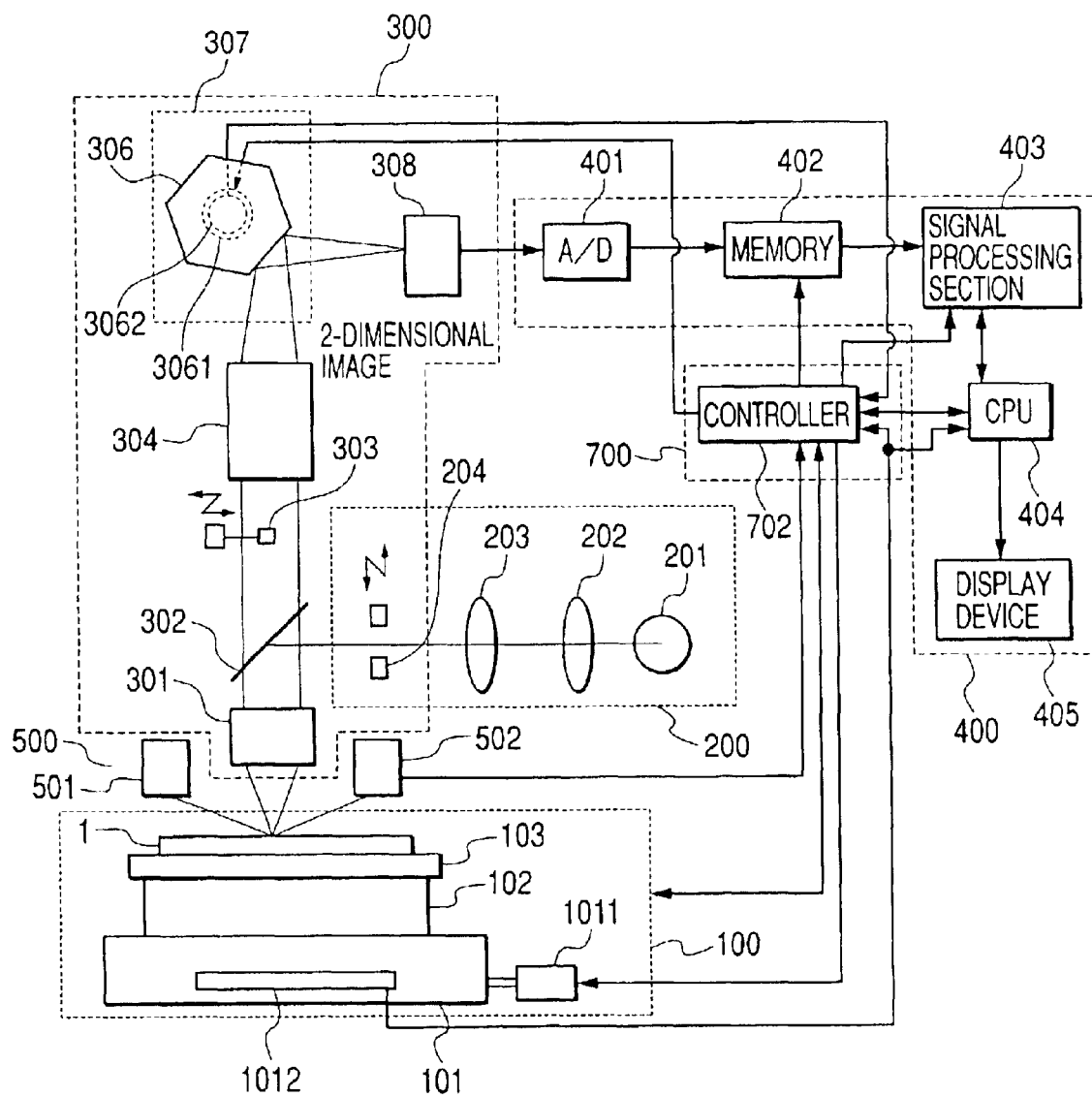
FIG. 2 is a constitutional view showing first and third embodiments of an apparatus for measuring alignment accuracy according to this invention.

At first, a first embodiment of an apparatus for measuring alignment accuracy (overlay accuracy) according to this invention is to be described with reference to FIG. 2 to FIG. 17. A first embodiment of the apparatus for measuring the alignment accuracy according to this invention comprises, as shown in FIG. 2, a stage 100, an optical source 200, a detection section (unit) 300, an image processing section (unit) 400, a controller section (unit) 700 and an automatic focus detection section (unit) 500.

Figure 5A:
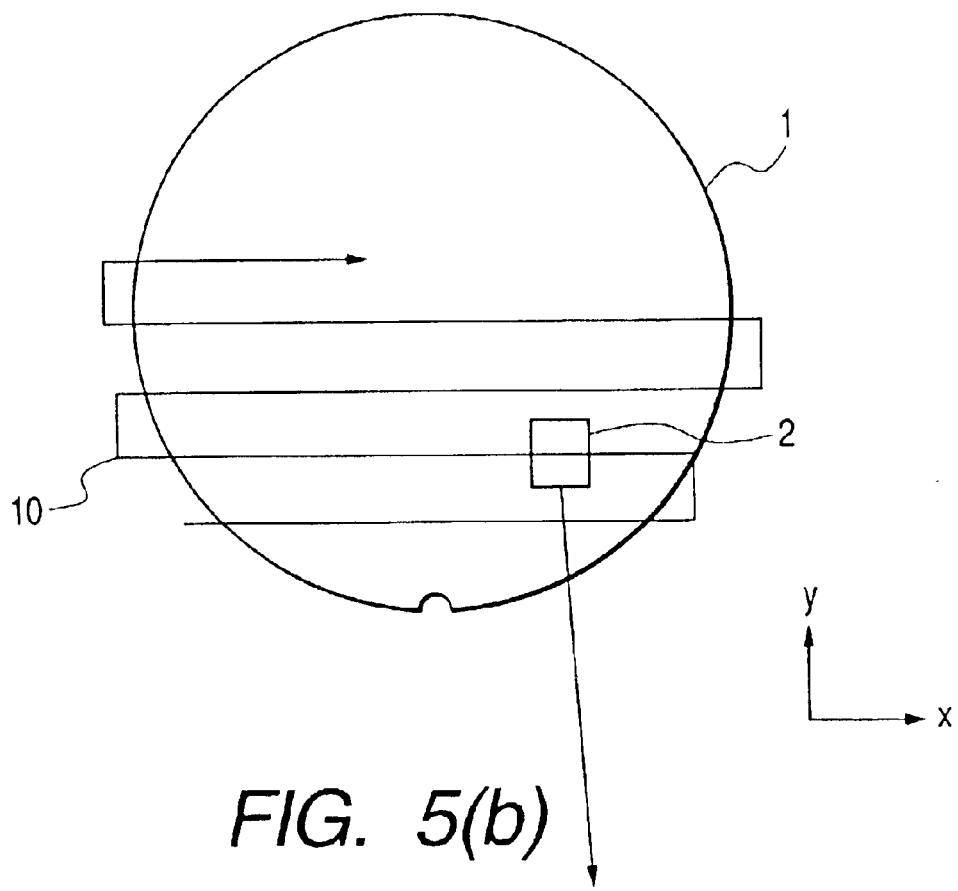
FIG. 5 is a view showing a running trace to a wafer by an XY stage and an alignment mark area disposed in a chip unit or an exposure unit in this invention.
Figure 5B:
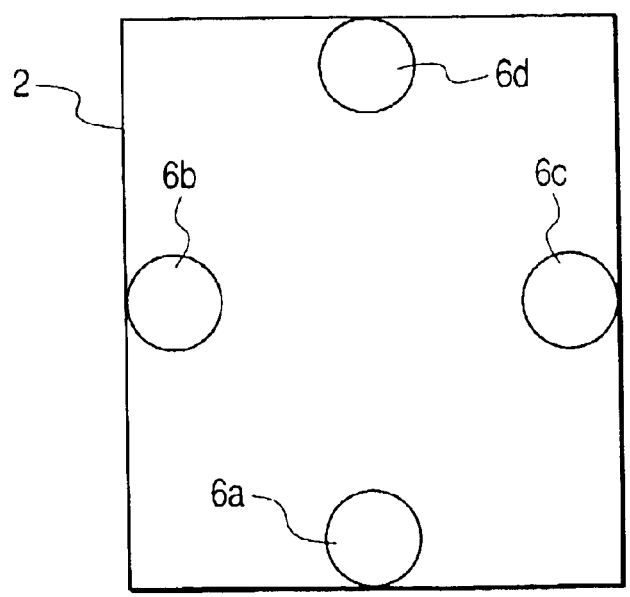

The stage 100 comprises a substrate chuck 103 for mounting a substrate 1 such as a wafer, a Zθ stage 102 having a Z stage for moving the substrate chuck 103 in the direction of height and a θ stage for rotating the chuck 103 within a plane, and an XY stage 101 for moving the substrate chuck 103 in the directions x and y, for example, as shown by a moving trace 10 in FIG. 5A.

The optical source section 200 comprises an optical source 201, a condensing lens 202, an optical source focusing lens 203 and an optical source filter 204 for spot illumination or ring illumination. That is, the optical source section 200 focuses an image of an optical source from the optical source 201 by way of the condensing lens 202 and the optical source focusing lens 203 to a position of the optical filter 204. The optical source filter 204 may be a filter to form a spot illumination secondary optical source 2041 shown in FIG. 7A, or an optical filter to form a ring illumination secondary optical source 2042 shown in FIG. 8A. The optical source filter 204 is at a Fourier conversion position of the objective lens 301, and a light emitting from the optical filter 204 illuminates a measuring point on the substrate 1 by way of a half-mirror 302 and the objective lens 301.

Figure 8A:
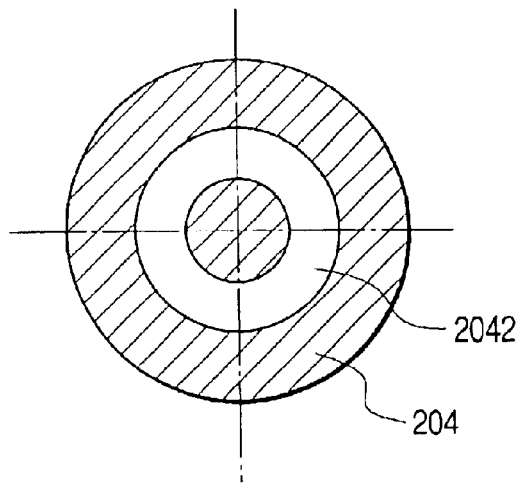
FIG. 8 is a view showing an optical source filter and a focusing filter of a ring-like shape according to this invention.
Figure 8B:
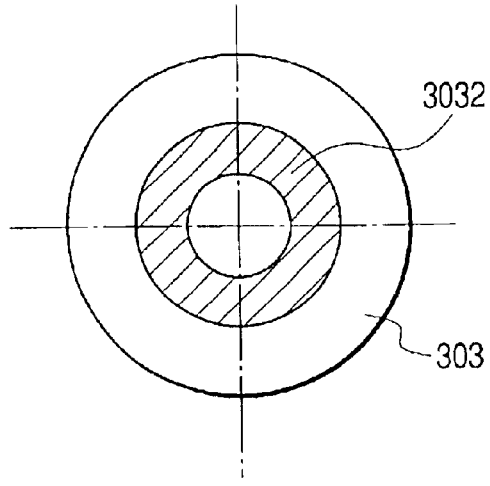

The optical source 201 may be a filament type such as a halogen lamp or a discharge tube type such as a metal halide lamp, xenon lamp, mercury lamp or mercury-xenon lamp, or it may be a visible light laser such as secondary modulated wave of YAG laser (532 nm), Ar ion laser or He—Ne laser, or UV-region laser such as four-order harmonic wave of YAG laser (266 nm), secondary harmonic wave of Ar ion laser (for example, 244 nm) or excimer laser (KrF, ArF, $F_2$, etc.). In the case of a visible or UV-laser light, it requires means (light system) such as scanning of a laser beam (which may also be a multi-laser beam) at a position of the optical source filter 204 (secondary optical source) in a ring-like form 2042 as shown in FIG. 8A, or reduction of interference using fibers of different length in order to decrease interference. As described above, when the coherent property of the laser beam is utilized, since the objective lens 301 can be provided in the form of reducing the aberration, accuracy for measuring the alignment accuracy can be improved. It is not also necessary to utilize the coherent property of the laser beam, but the purpose can be attained also by using a filament lamp or a discharge lamp as the optical source 201 and disposing a band filter such as an interference filter or a sharp cut filter at any position from the optical source 201 and the substrate 1.

Figure 3:
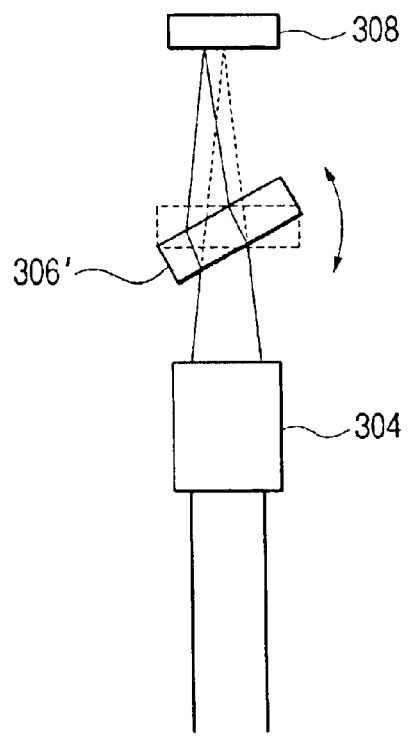
FIG. 3 is a view showing a modified example of a scanning optical system shown in FIG. 2.
Figure 4:
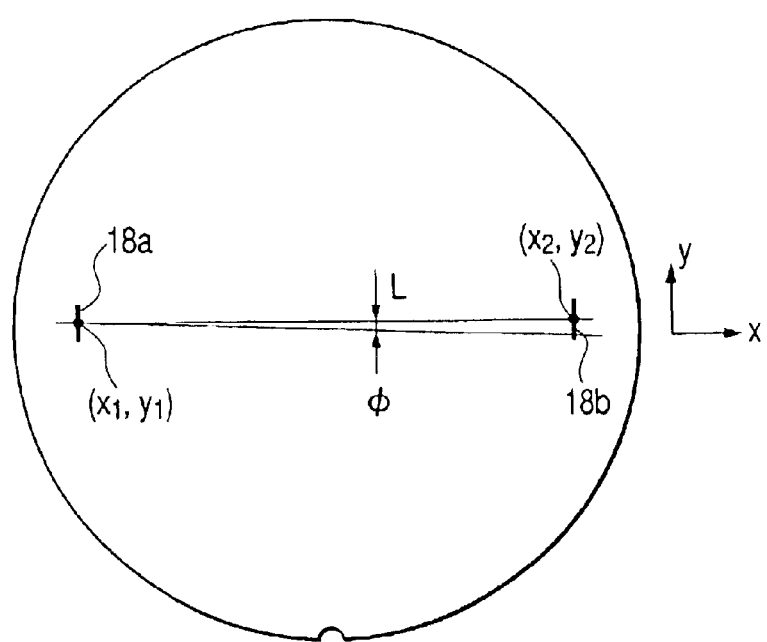
FIG. 4 is an explanatory view for the correction of a rotational displacement of a wafer.
Figure 9:
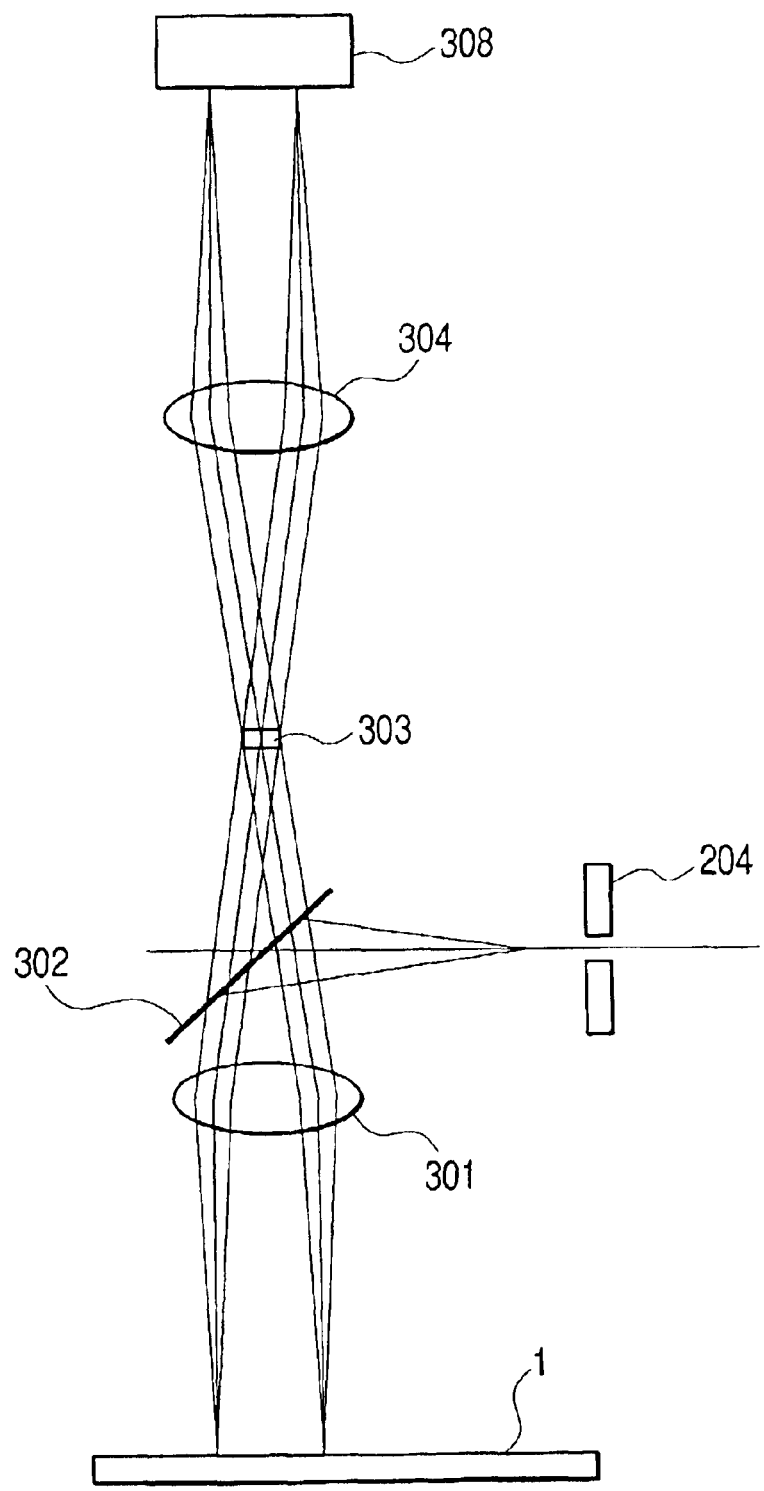
FIG. 9 is a view showing a positional relation for an optical source filter, a focusing filter, an objective lens, a focusing lens and a substrate according to this invention.
Figure 10:
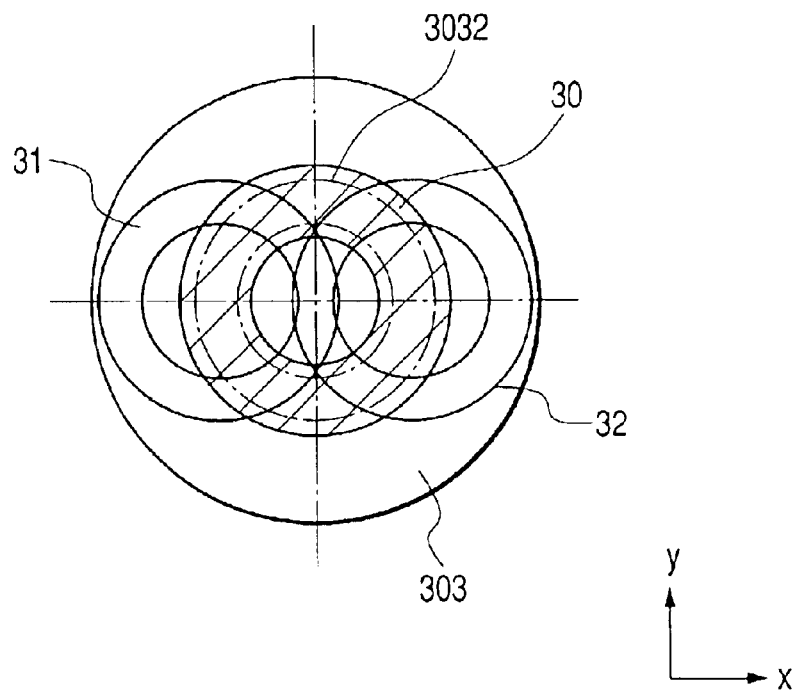
FIG. 10 is a view showing a relation of a diffraction image at a pupil position as viewed in the direction of a light axis according to this invention.
Figure 11:
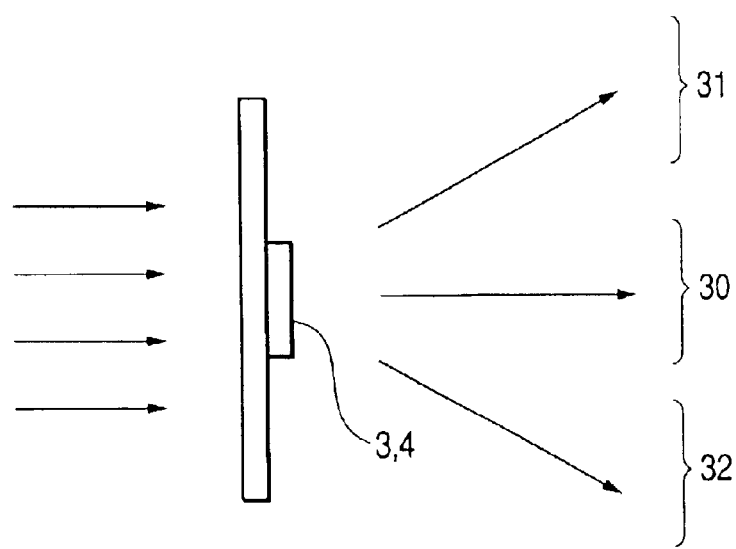
FIG. 11 is a view for explaining a diffraction phenomenon in a pattern to be measured according to this invention.
Figure 12:
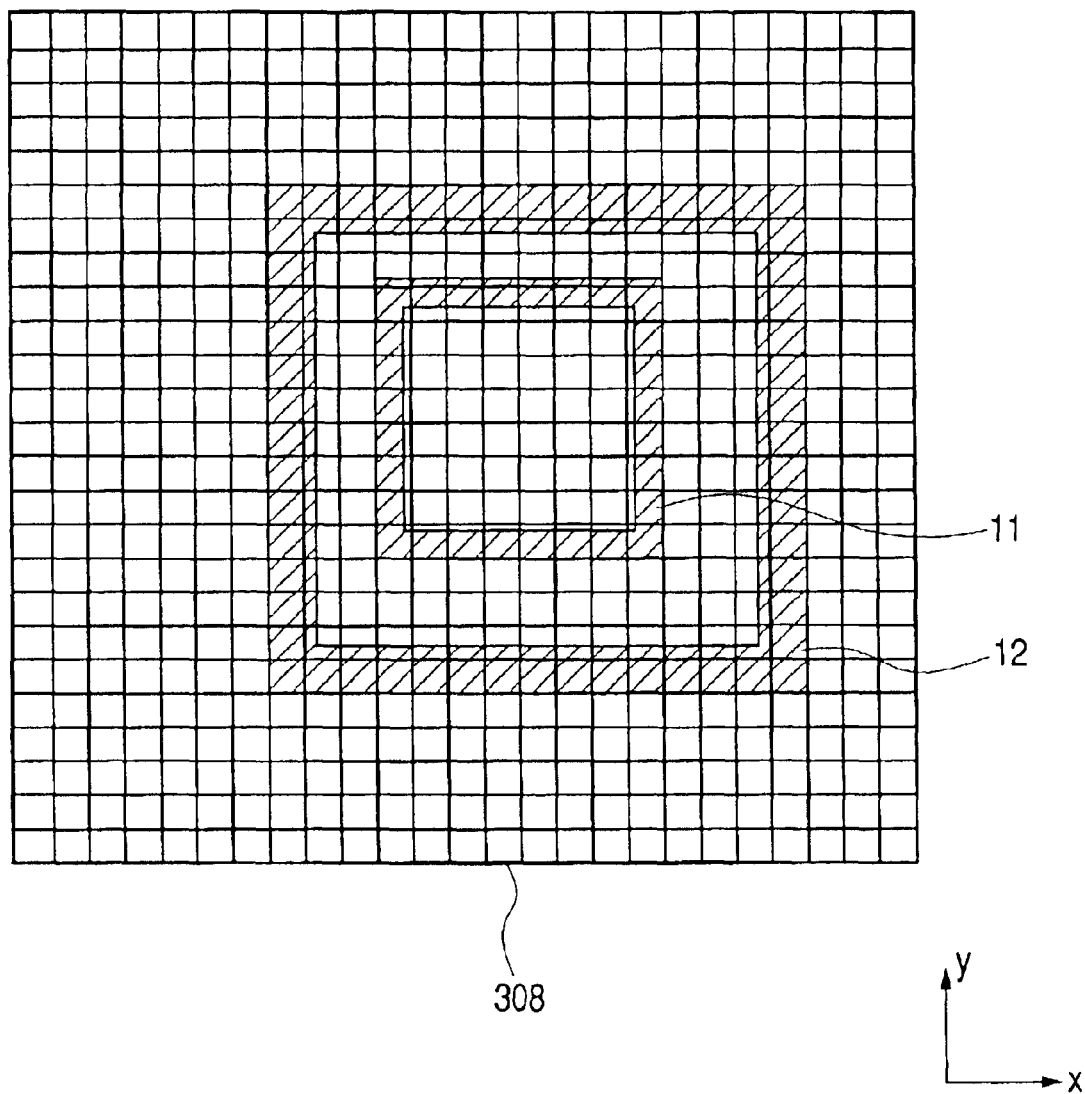
FIG. 12 is a view showing the state of imaging a pattern to be measured which is made static in a state of running an X stage by a 2-dimensional sensor (detector) according to this invention.

The detection section 300 comprises the objective lens 301, the half-mirror (may be a polarization beam splitter in a case of using a linearly polarized light as the optical source) 302 that reflects an illumination light emitted from the optical source section 200, while transmits a reflection light from alignment mark portions, a focusing filter 303 for shutting 0-order diffraction reflection light from the alignment mark portions, a focusing lens 304 for focusing primary or higher order diffraction reflection light transmitting the focusing filter 303 to a detector 308, a synchronization unit 307 having an optical scanning system (for example, polygon mirror 306) that scans moving images detected, for example, in synchronization with the movement of the X stage in the opposite direction and set them statically on the detector 308 and a 2-dimensional detector 308 constituted with a 2-dimensional image sensor. That is, a light reflected, deflected and scattered from the measuring point on the substrate 1 is focused by way of the objective lens 301 and the focusing lens 304 onto the 2-dimensional detector 308. In this case, 0-order diffracted light image the 0-order diffracted optical image (regular reflection optical image) of the illumination filter 204 is shut by the focusing filter 303 shown in FIG. 7B and FIG. 8B. The focusing filter 303 shown in FIG. 7B has a circular filter 301 while the focusing filter 303 shown in FIG. 8B has a ring filter 302. That is, as shown in FIG. 9, the illumination filter 204 and the focusing filter 303 are located at the conjugation position of the optical system with the objective lens 301, substrate 1 and the objective lens 301. Then, the images of primary or higher order diffracted light passing the focusing filter 303 are scanned by the scanning optical system (for example, polygon mirror) 306 and then focused through the focusing lens 304 onto the 2-dimensional detector 308. In this case, the scanning optical system 306 has a constitution for forming primary or higher order refracted light images 11, 12 from each of the alignment mark portions 3, 4 as static images on the 2-dimensional detector 308 when the X-stages runs. FIG. 3 shows a scanning optical system 306 that scans optical images by utilizing diffraction, for example, by rotating a prism 306' such as a parallel plate glass. FIG. 10 shows a 0-order diffracted light 30 incident to the pupil (view field) of the objective lens 301 obtained from alignment mark portions 3, 4 in a case of ring illumination and a primary order diffracted light 31, 32 undergoing primary diffraction in the direction x. FIG. 11 shows the state of occurrence of a 0-order diffracted light 30 and primary order diffracted lights 31, 32 formed from a linear pattern of the alignment mark portions 3, 4 upon spot illumination or ring illumination to the alignment mark portions 3, 4. As has been described above, images of the primary or higher order refraction lights from the alignment mark portions 3, 4 (optical images emphasized with the primary or higher order diffraction lights formed from the linear edges of the refinement marks 3, 4) 11, 12 are focused, as shown in FIG. 12, as static images on the 2-dimensional detector 308. For example, image signals 41, 42 are detected from one line as shown in FIG. 13A. By the way, the effect of distortion of the magnification ratio of a focusing optical system such as the objective lens 301 etc. can be minimized by detecting the static image by the 2-dimensional detector 308 when the center for the alignment mark portion 3, 4 situates at the center for the optical axis of the objective lens 301. Any way, the optical filter 204 and the focusing filter 303 are disposed so as to correspond to the alignment mark optical images at low contrast (optical images emphasized for linear edges of the alignment mark) by shutting (shielding) the 0-order diffracted light. Accordingly, there is no requirement of providing the optical source filter 204 and the focusing filter 303 in a case where an alignment mark optical images at high contrast can be obtained. Then, both of the situations can be coped with by providing a mechanism capable of intruding and retracting the optical source filter 204 and the focusing filter 303.

The image processing section 400 comprises an A/D converter 401 for converting 2-dimensional image signals detected from the 2-dimensional detector 308 by A/D conversion into 2-dimensional digital image signals, a memory 402 for storing the 2-dimensional digital image signals converted by the A/D converter 401, a signal processing section 403 for reading out the 2-dimensional digital image signals stored in the memory 401 and calculating misalignment in the direction x and in the direction y between the alignment mark 4 and the alignment mark 3 (Δx, Δy), a computer (CPU) 404 that calculates misalignment vectors at plural points in each chip based on the misalignment between the alignment mark 4 and the alignment mark 4 at plural positions in each chip calculated from the signal processing section 403, a display device 405 constituted with a display as an output device, and an input device also including a key board or a network (not illustrated). That is, the 2-dimensional image signals detected by the 2-dimensional detector 308 are put to analog-digital conversion by the A/D converter 401 and stored as detection signals in the memory 402. Upon storing, coordinate information on the substrate 1 obtained from a controller 702 based on the displacement signal of the XY stage 101. The signal processing section 403 reads out the 2-dimensional image information for each of the alignment mark portions 6 stored in the memory 402, and calculates the alignment accuracy (Δx, Δy) for each of the alignment mark portions 6 by using a desired algorithm. The result of the calculation for the alignment accuracy of each mark portion 6 calculated in this step is stored in the memory device (not illustrated) controlled by the CPU 404, or it is processed by the CPU 404 and displayed on the display device 405. Alternatively, it is transferred, for example, to the system of a semiconductor production line (not illustrated).

The controller section 700 comprises a controller 702 that calculates a control instruction for controlling, for example, the Z stage based on the focus data detected from an automatic focus detection section, calculates a synchronization control instruction, for example, based on the displacement of the X stage detected from a displacement detector 1012 such as a linear encoder or a length measuring laser device and a rotational angle of the scanning optical system (for example, polygon mirror) 306 detected by a rotational angle detector 3062 and, further, controls a driving source of the XY stage 101 (1011 denotes a driving source for X stage), a driving source for a focus controlling Z stage (not illustrated), a driving source for the θ stage (not illustrated) and a rotational driving source 3061 of the scanning optical system 306 based on the control instruction. Further, the controller 702 inputs address data to the memory 402 based on the detected positional coordinate on the wafer and inputs the detected positional coordinate on the wafer to the signal processing section 42.

The automatic focus detection section 500 comprises, optically, an illumination section 501 and a detection section 502. The automatic focus detection section 500 includes those for optically detection, for example, positional displacement detection of regular reflection beam on oblique spot light illumination/linear sensor, stripe pattern projection/stripe pattern detection, optical pattern contrast detection or optical interference detection, and those for direct detection of the displacement in the direction of the height at the surface of the wafer such as air micro detection or electrostatic capacitance detection. Since there is usually present an offset between the focal position detected by the automatic focus detection section 500 and an actual focal position, it is necessary to measure the offset value previously and set the offset value to the controller 702. Since the situation near the surface of the wafer varies depending on the kind of the object to be measured for the misalignment and on every process steps of the object, further the misalignments are measured while moving the wafer continuously, it is necessary to previously calculate and set the offset value. The offset value is set by mounting an object to be measured (wafer) manufactured as an identical kind and by the identical process steps with those for the object to be measured for misalignment on a substrate chuck, retracting the optical source filter 204 and the focusing filter 303, detecting in this state images at a desired position 6 where alignment mark 3, 4 as the object to be measured by the 2-dimensional sensor 308 while vertically moving the Z stage in a static state of the XY stage 101 and the scanning optical system (for example, polygon mirror) 306 and determining the height data detected by the automatic focus detection section 500 at the position where the contrast between the images 11, 12 for the detected alignment marks 3, 4 is highest. Accordingly, an optimal focused state can be obtained at any position on the wafer 1 by controlling the Z stage such that the height data detected by the automatic focus detection section 500 reaches the offset value set in the controller 702, upon calculation for the misalignment amount between the alignment mark 4 and the alignment mark 3 by forming the static state of images 11, 12 for the alignment mark portions prepared on the 2-dimensional detector 308 in the scanning optical system 306 while running the X stage.

Description is to be made next to an embodiment capable of greatly shortening the time required for a sheet of wafer to be measured for the misalignment even when the misalignment measuring positions 6 are formed, for example, at four positions on every exposure fields formed on the wafer 1 and the number of measuring portions for misalignment on the wafer 1 is increased as large as 100 positions.

At first, the substrate (wafer) 1 to be measured for the misalignment which is mounted on the substrate chuck 103 and attracted by a vacuum suction device or the like is controlled for the rotation by using the θ stage. That is, each of patterns 18a and 18b such as alignment marks at two positions formed in line-to-line symmetry at the periphery of the wafer 1 is detected by the 2-dimensional detector 308, and the central position coordinate (x1, y1) and (x2, y2) are calculated to determine the center-to-center distance: L= $\sqrt{(x2-x1)^2+(y2-y1)^2}$, thereby enabling to calculate the angle of inclination φ for the wafer as an object to be measured relative to the running direction of the X stage in view of the relation: sin φ=(y2−y1)/L. Accordingly, the rotation of the wafer 1 is controlled by using the θ stage so as to eliminate the angle of inclination θ. As a result, the linear components for the alignment marks 3, 4 are substantially directed to the running direction of the X-stage and the Y-stage.

Figure 6A:
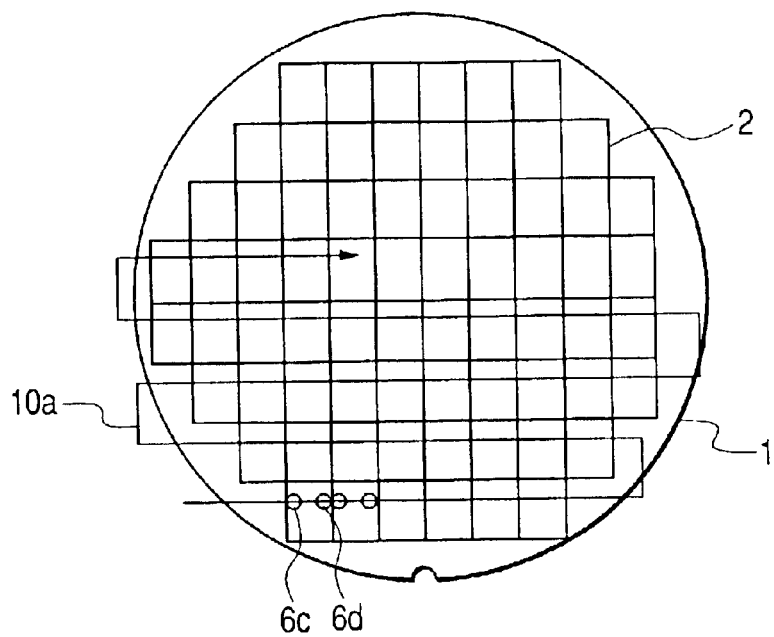
FIG. 6 is a view showing a relation between a running trace to a wafer by an XY stage and a mark portion disposed in a chip unit or an exposure unit in this invention.
Figure 6B:
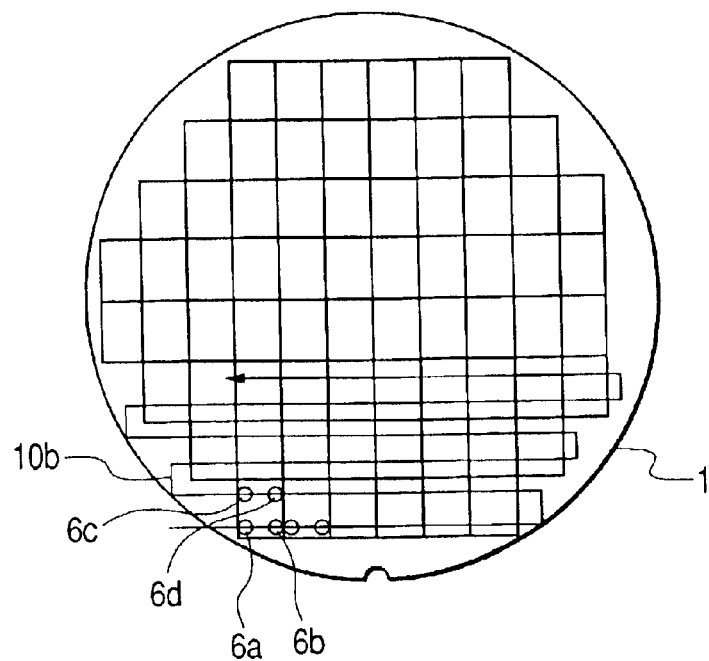
Figure 7A:
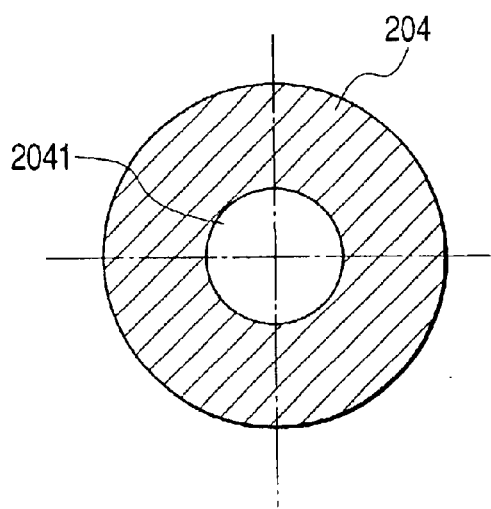
FIG. 7 is a view showing an optical source filter and a focusing filter of a circular shape according to this invention.
Figure 7B:
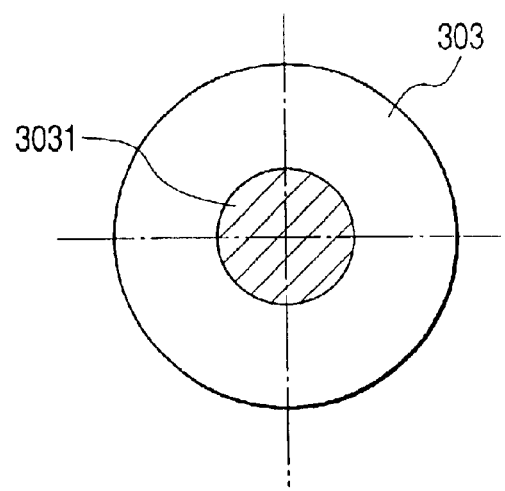

Then, misalignment is measured actually. At first, the wafer 1 controlled for rotation is moved by the movement of the XY stage 101 along the moving trace 10 as shown in FIG. 5A. Numeral 2 denotes an exposure field (exposure unit) comprising one or plural chips arranged on the wafer 1. The alignment marks 3, 4 for measuring misalignment are formed, for example, at four positions (6a–6d) in the exposure field 2, and the moving trace 10 passes over the alignment mark portions 3, 4 (6a–6d) at the four positions. That is, the moving trace 10 is set such that the alignment mark portion 6 as the position for measuring misalignment passes through the center of the optical axis of the objective lens 301. Alternatively, the moving trace 10 can be 10a, 10b as shown in FIGS. 6A, and 6B. In the case of the moving trace 10a, it passes the alignment mark portions 6c, 6d two positions on every exposure field 2. Further, in a case of the moving trace 10b, it passes the alignment mark portions 6a–6d four positions on every exposure field 2.

When the X stage is caused to run at a high speed of about 100 m/s and substantially at a constant speed so as to draw the moving trace 10 and, simultaneously, the scanning optical system (for example, polygon mirror) 306 is rotated in the opposite direction in synchronization with the X stage thereby scanning the optical images 11, 12 of the running alignment marks obtained by the objective lens 301 and the focusing lens 304, optical images 11, 12 for the static alignment marks can be prepared on the 2-dimensional detector 308. By the way, the mirror surface of the scanning optical system 306 scans the optical images for each alignment mark portion 6 in the direction opposite to the running of each alignment mark portion by the X table, and static optical images for each alignment mark portion is focused and photographed (imaged) on the 2-dimensional detector 308. In this case, since the offset value for the automatic focusing is previously set to the controller 702, the controller 702 can always control to the optimal focus state based on the height information detected from the automatic focus detection section 500.

With the procedures described above, in a state of running the X stage at a high speed of about 100 mm/s, the 2-dimensional detector 308 can image the 2-dimensional images for the alignment marks 3, 4 in each of the alignment mark portions (20 to 40 μm□) 6 and output image signals at a rate of 25 to 50 MHz per one pixel, and can detect them as image signals from the alignment mark portion 6 at 120 to 240 positions per one sheet of wafer in about 1 min.

As described above, the image signals for each alignment mark portion detected as static 2-dimensional images shown in FIG. 12 successively by the 2-dimensional detector 308 from each of the alignment mark portions 6 at 100 or more positions on the moving trace 10 per one sheet of wafer 1 are put to analog-digital conversion by the A/D converter 401 and stored as 2-dimensional detection signals (shown as 41, 42 for 1 line in FIG. 13A) also including the coordinate information on the substrate in the memory 402. The signal processing section 403 reads out the 2-dimensional image information also including the coordinate information on the substrate for each of the alignment mark portions at 100 or more positions stored in the memory 402. Then, the signal processing section 403 calculates the alignment accuracy in the direction x and the direction y ($\Delta$x, $\Delta$y) for each of the alignment mark portion as shown in FIG. 13B by applying integration or averaging for plural lines with respect to the x direction and the y direction by using an algorithm such as a method of simply binarizing each of signals 41$a$, 41$b$: 42$a$, 41$b$ with a predetermined threshold value and determining the center thereof to decide the center for each of the signals 41:42, or a method of directly determining the center for each of the signals 41:42 by a symmetric pattern matching processing. Particularly, upon integration or averaging over plural lines in the direction x and direction y, integration or averaging may be applied while saving specific line image signals. The result for the calculation of the alignment accuracy for each of the alignment marks portions is stored in a not illustrated memory device controlled by the CPU 404, or it is fabricated by the CPU 404 and displayed on the display device 405 or transferred to a system of the semiconductor production line (not illustrated).

Figure 14:
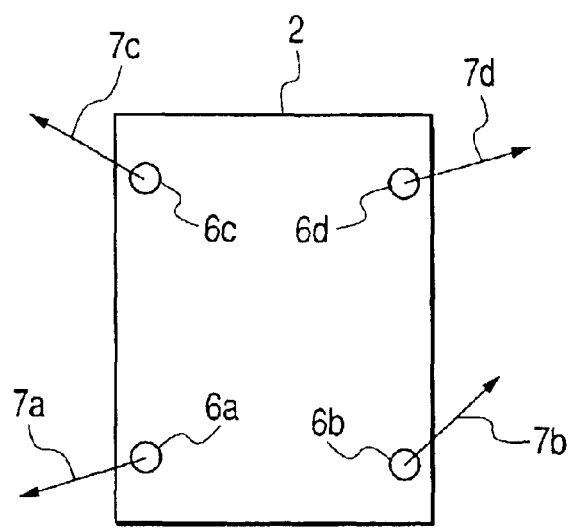
FIG. 14 is a view showing a misalignment vector calculated from an alignment mark portion disposed in a chip unit or an exposure unit as a result of measurement according to this invention and an indication example thereof.

As described above, the CPU 404 calculates the misalignment amount on every mark portions 6 disposed in the exposure unit or the chip unit arranged on the wafer 1 and indicates the same as vectors 7 as shown in FIG. 14.

Figure 15:
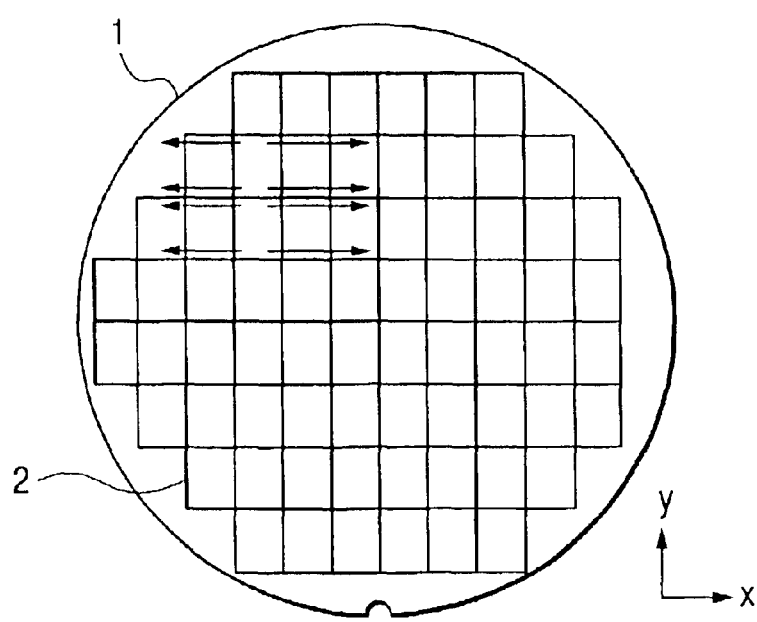
FIG. 15 is a view for an example of a misalignment vector calculated from an alignment mark portion disposed in chip units or exposure units arranged on a wafer as a result of measurement according to this invention and an indication example thereof.
Figure 16A:
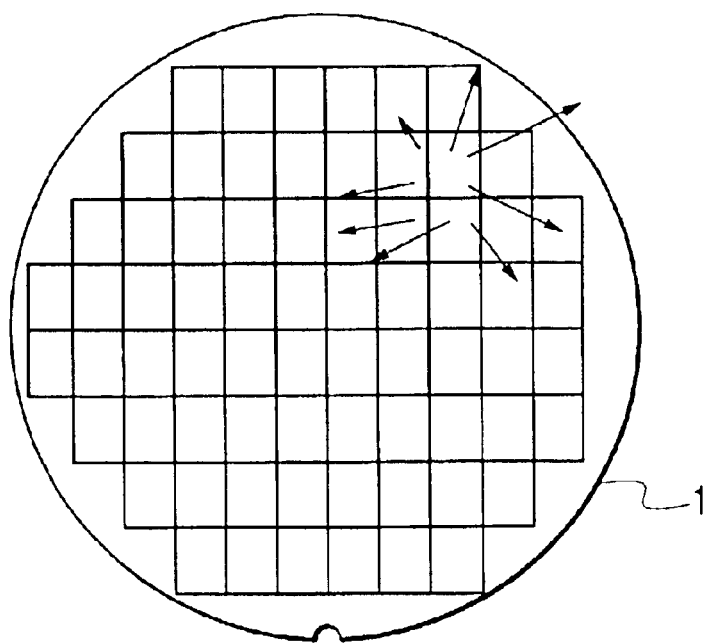
FIG. 16 is a front elevational cross sectional view showing other example of a misalignment vector calculated from an alignment mark portion disposed in chip units or exposure units arranged on a wafer as a result of measurement according to this invention, and an indication example thereof and a cause thereof.
Figure 16B:
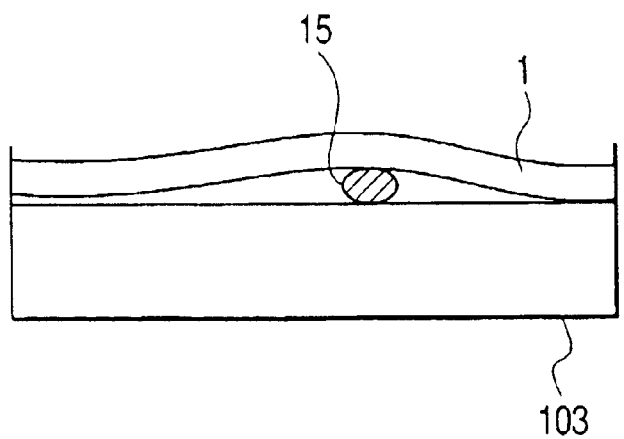
Figure 17A:
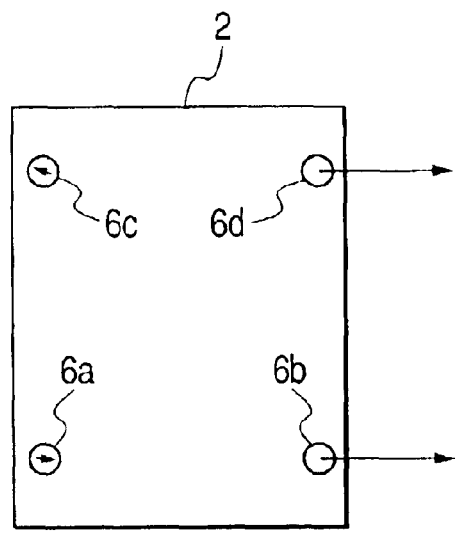
FIG. 17 is a view showing various modes of misalignment in a chip unit or an exposure unit as a result of measurement according to this invention and an indication example thereof.
Figure 17B:
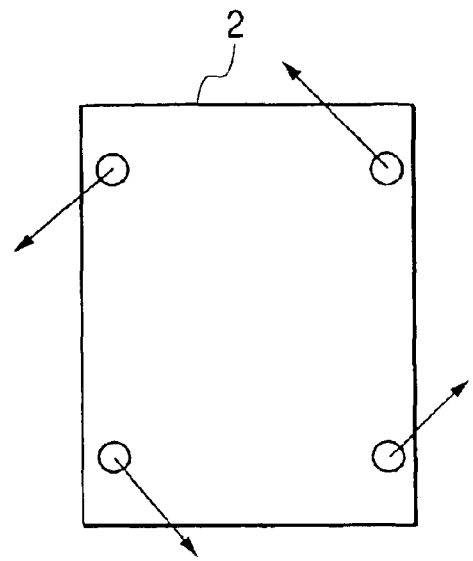
Figure 17C:
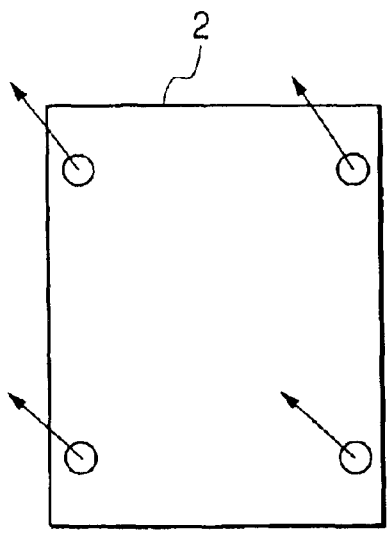
Figure 17D:
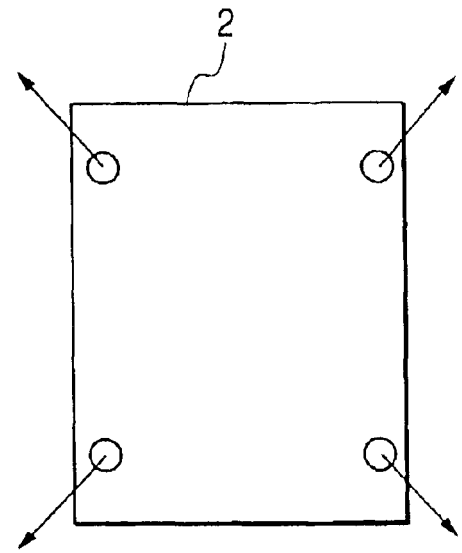

FIG. 15 and FIG. 16A represent the amount of misalignment to a specified chip unit or exposure unit 2 arranged on the wafer 1 as vectors 7. In the case shown in FIG. 15, since the amount of misalignment is different in the direction x, the CPU 404 can recognize that the exposure magnification ratio in the direction x is different between the exposure for the lower layer and the exposure for the upper layer. In the case shown in FIG. 16, since there is no directionality in the amount of misalignment only at a specified position, the CPU 404 can recognize that an obstacle 15 such as a foreign particle is intruded, for example, between the wafer 1 and the substrate chuck 103 when the lower layer is exposed or the upper layer is exposed.

Further, FIG. 17 shows various cases in which misalignment is caused to a specified chip unit or exposure unit 2 arranged on the wafer 1. The case shown in FIG. 17A is identical with that shown in FIG. 15. In the case shown in FIG. 17B, since the amount of misalignment shows an identical rotational vector at 4 positions, the CPU 404 can be recognize that the rotational misalignment has been caused between the case of exposing the lower layer and the case of exposing the upper layer. In the case shown in FIG. 17C, since the amount of misalignment shows a vector of an identical length in the same direction for all of four positions, the CPU 404 can recognize that the shifting misalignment is caused in the direction described above between the case of exposing the lower layer and the case of exposing the upper layer. In the case shown in FIG. 17D, since the amount of misalignment shows a vector each of identical length in the radial direction for all of four positions, the CPU can recognize that the magnification error has been caused between the case of exposing the lower layer and the case of exposing the upper layer. As described above, as shown in FIG. 14, in a case where misalignment vectors are formed at four positions, they can be decomposed into magnification ratio error component in the direction x and the direction y, rotational misalignment component, shifting misalignment component in the direction x and the direction y, as well as other components.

Figure 18:
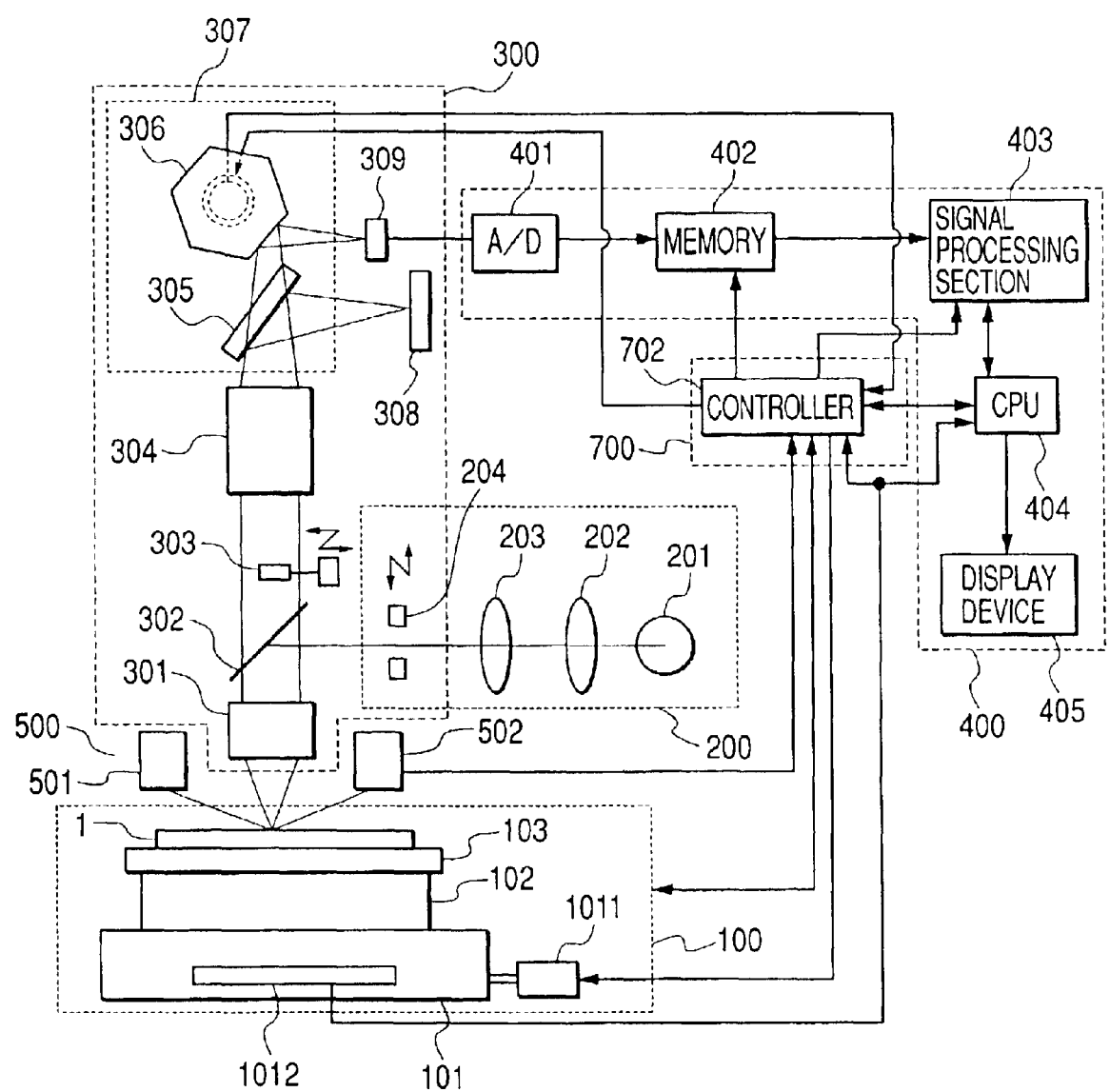
FIG. 18 is a constitutional view showing a second embodiment of an apparatus for measuring alignment accuracy according to this invention.

Then, a second embodiment of an apparatus for measuring the alignment accuracy according to this invention is to be described. FIG. 18 is a view showing the constitution of the second embodiment of an apparatus for measuring alignment accuracy according to this invention. The second embodiment is different from the first embodiment in that a detection section 300 comprises a branching optical system 305, a 2-dimensional detector 308 for receiving one of optical images branched by the branching optical system 305, a scanning polygonal system (for example, polygon mirror) 306 for scanning the other of the optical images branched by the branching optical system 305 at a speed slightly lower than the running speed of the X table and a 1-dimensional detector 309 comprising a CCD sensor or the like, and a switch (not illustrated) for switching 2-dimensional images obtained from the 2-dimensional vector 308 and, basically, 1-dimensional images obtained from a 1-dimensional vector 309 is disposed to stop the X-stage upon detection of images by the 2-dimensional detector 308.

That is, in the wafer 1, since high alignment accuracy is required at the process step nearest to a semiconductor device such as a gate of the semiconductor device and the through hole near the gate or the gate wirings thereon, for the object to be measured exposed in this step the optical image of the alignment mark 6 can be detected by the 2-dimensional detector 308 as shown in FIG. 12, when the X table is stopped while positioning the alignment mark portion 6 about at the center thereof to the optical axis of the detection section 300. Accordingly, so that misalignment of the optical images 11 for the alignment mark 3 of the upper layer and the optical images 12 for the alignment mark 4 of the lower layer ($\Delta$x, $\Delta$y) can be measured at a high accuracy. In short, for the wafer to be measured in the process steps requiring high alignment accuracy, it takes more measuring time since preference is taken for the measuring accuracy.

Figure 19:
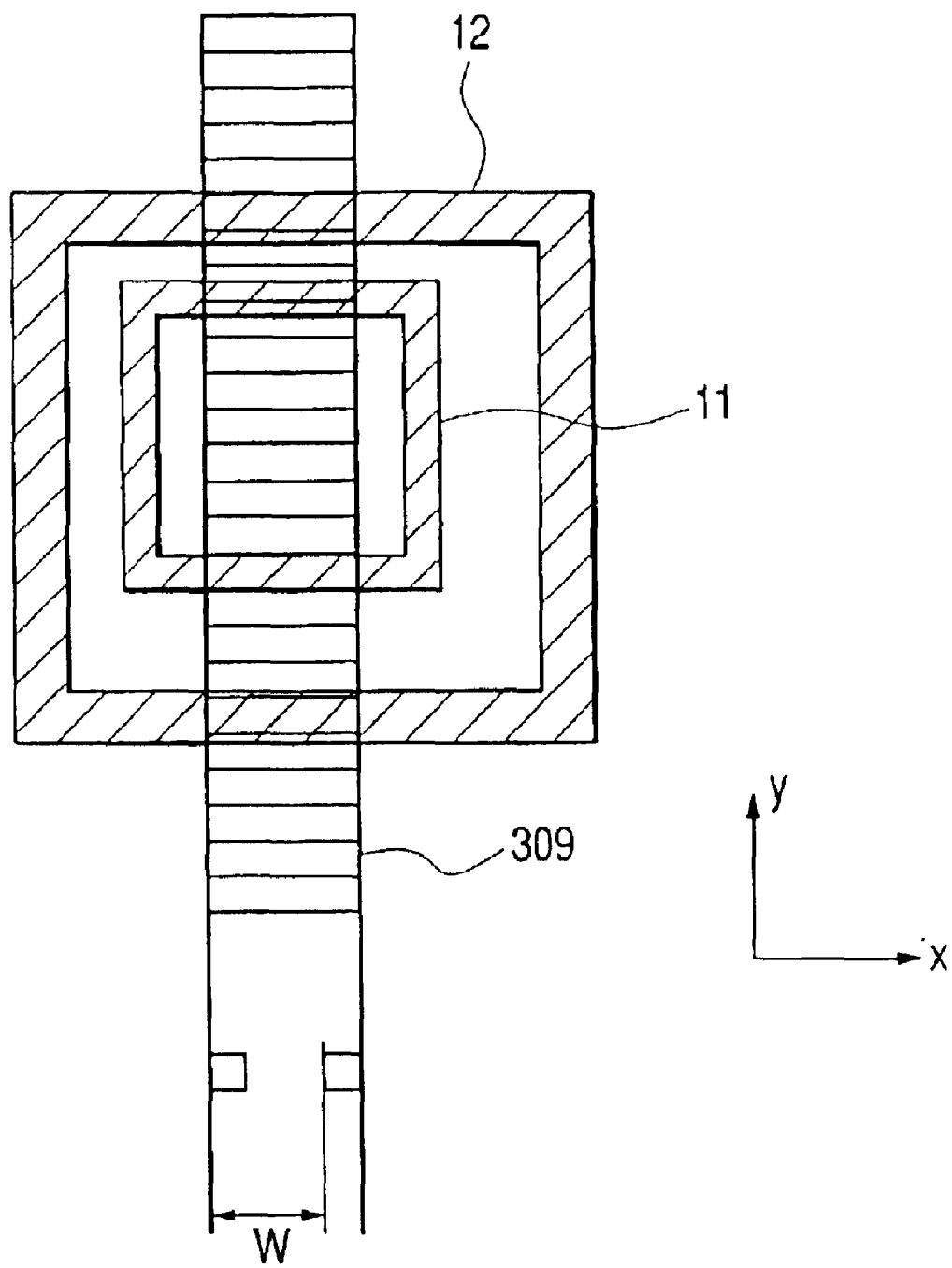
FIG. 19 is a view showing a state of imaging a pattern to be measured that moves at a width W in a state of running an X-stage by a 1-dimensional sensor (detector) in a second embodiment.
Figure 20A:
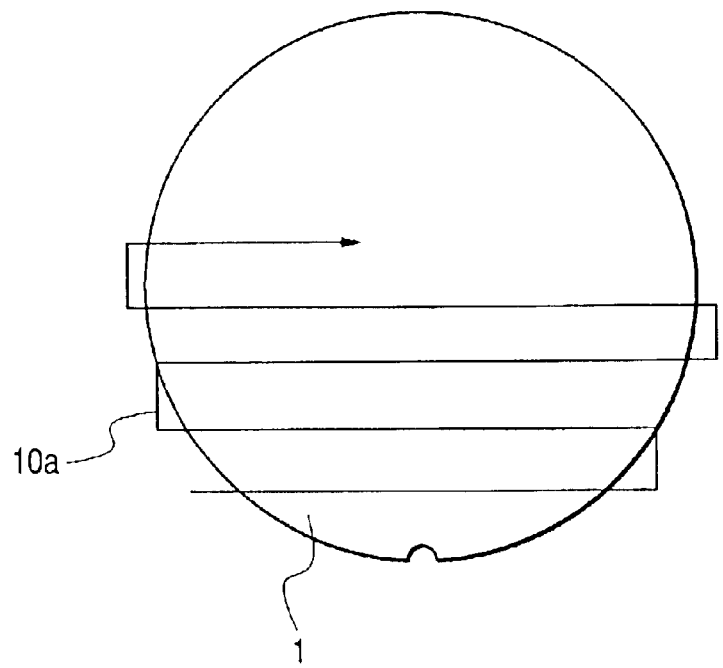
FIG. 20 is an explanatory view for a running trace of a wafer rotated by 90° in the second embodiment.
Figure 21:
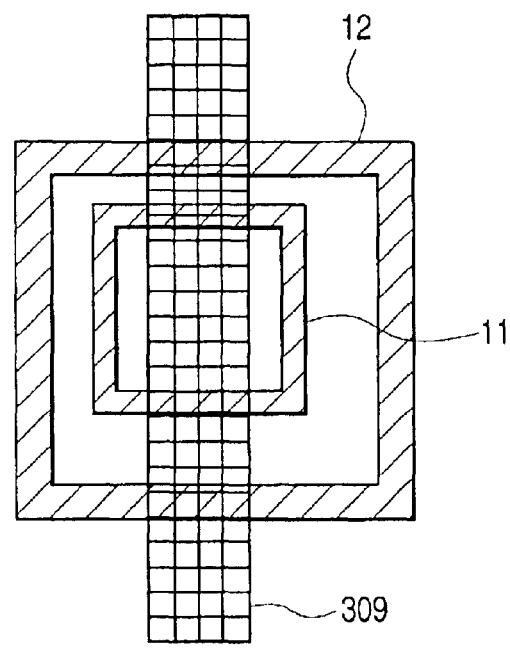
FIG. 21 is a view showing a stage of imaging a pattern to be measured in a state of running an X-stage according to this invention by a TDI image sensor as a 1-dimensional sensor (detector)

On the other hand, since no high alignment accuracy as described above is required to the wiring layers at the upper layer above the vicinity of the gate in the wafer 1, the running optical images detected in a state of running the X table at a high speed of about 100 mm/s along the running trace 10 as shown in FIG. 20A are scanned in the opposite direction with a slight delay by the scanning optical system 306. Then, as shown in FIG. 19, the 1-dimensional detector 309 such as a CCD sensor moves by a width W (for example, by about 100 pixels) in view of the appearance to optical images 11, 12 of the alignment marks 3, 4, and image signals indicative of the misalignment amount for the alignment marks 3, 4 for the width W can be read out at 25 to 50 MHz per one pixel from the 1-dimensional detector 309, and the amount of misalignment in the direction y can be measured at a relatively high accuracy in a state of running the X table at a high speed of about 100 mm/s. As described above, since the optical images 11, 12 of the alignment marks 3, 4 can be detected as images at a width of W also by using the 1-dimensional detector 309, the amount of misalignment in the direction y ($\Delta$y) can be measured at a relatively high accuracy. Further, since the square shape is used for both of the alignment marks 3 and 4, a TDI sensor can be used as the 1-dimensional detector 309 as shown in FIG. 21. FIG. 21 shows a state in which the TDI sensor photographs (images) the alignment mark optical images 11, 12.

However, since the amount of misalignment has to be measured also in the direction x, the wafer is rotated by 90°, for example, by using the θ stage and the running optical images detected in a state of running the X table at a high speed of about 100 mm/s are repetitively scanned in the opposite direction with a slight delay by the scanning optical system 306 to measure the amount of misalignment in the direction x ($\Delta$x). As described above, although it is necessary to rotate the wafer 1 by 90°, 1-dimensional images at a width W for the alignment marks 3, 4 can be photographed for each of the alignment mark portions (20–40 $\mu$m□)6, and they can be detected as image signals in the directions x and y from the alignment mark portions at 120 to 240 positions per one sheet of wafer in about several minutes.

Naturally, it is also possible for using the 2-dimensional detector as in the first embodiment instead of the 1-dimensional detector 309 and scanning the running optical images in the opposite direction in a state of running the X stage by the scanning optical system 306, thereby slightly displacing (delaying) as described above or setting them stationary on the 2-dimensional detector, and detecting 2-dimensional images of the alignment marks 3, 4 for each of the misalignment measuring portions 6.

According to the second embodiment described above, it is possible to switch between a case of giving preference to high accuracy in the accuracy for misalignment measurement and a case of giving a preference to the high speed to shorten the measuring time while somewhat lowering the accuracy in the accuracy for misalignment measurement in accordance with the kind of the wafer and the process steps.

Figure 22:
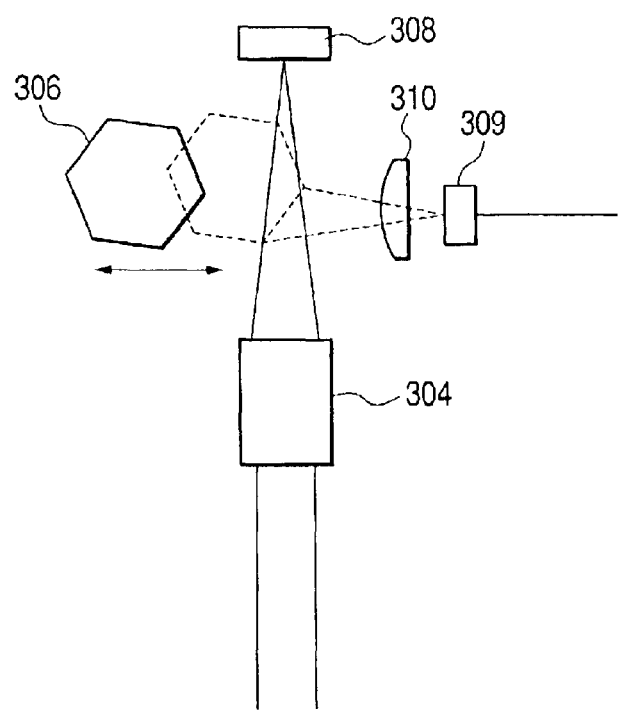
FIG. 22 is a view showing a case of advancing and retracting a scanning optical system as a modified example of a second embodiment of an apparatus for measuring alignment accuracy according to this invention.

FIG. 22 shows a modified example of the second embodiment. In this modified example, the scanning optical system 306 is made retractable while the branching optical system 305 being removed. In FIG. 22, a cylindrical focusing lens 310 is disposed for focusing images on the 1-dimensional detector 309. With the constitution described above, the optical scanning system 306 is inserted into the optical channel in a case of giving preference to the high speed, while the scanning optical system 306 is retracted in a case of giving preference to high accuracy.

Then, a third embodiment of an apparatus for measuring alignment accuracy according to this invention is to be described. In the third embodiment, the optical scanning system 306 in the first embodiment shown in FIG. 2 is removed, and optical images 11, 12 for the alignment mark portion 6 focused by the focusing optical system 304 are formed by a parallel read sensor comprising a TDI sensor as a high speed sensor or a multi-channel 1-dimensional sensor. The multi-channel 1-dimensional sensor is constituted, for example, with plural linear sensors each of 64 pixel element capable of reading 64 pixels on every linear sensor arranged in series so as to read on every channels. In a case of the parallel read sensor such as the TDI sensor as described above, reading at 20 to 50 MHz is possible and even when optical images 11, 12 for the alignment mark portion 6 to be received are caused to run along with running of X stage, image signals capable of calculating the amount of misalignment in the direction y ($\Delta$y) can be obtained. Further, also in a case of arranging a plurality of multi-channel 1-dimensional sensors in series so as to read on every channels, and even when optical images 11, 12 of the alignment mark portion 6 to be received along with the running of the X stage at a speed depending on the number of channels, image signals capable of calculating the amount of misalignment ($\Delta$y) in the direction y can be obtained.

Figure 20B:
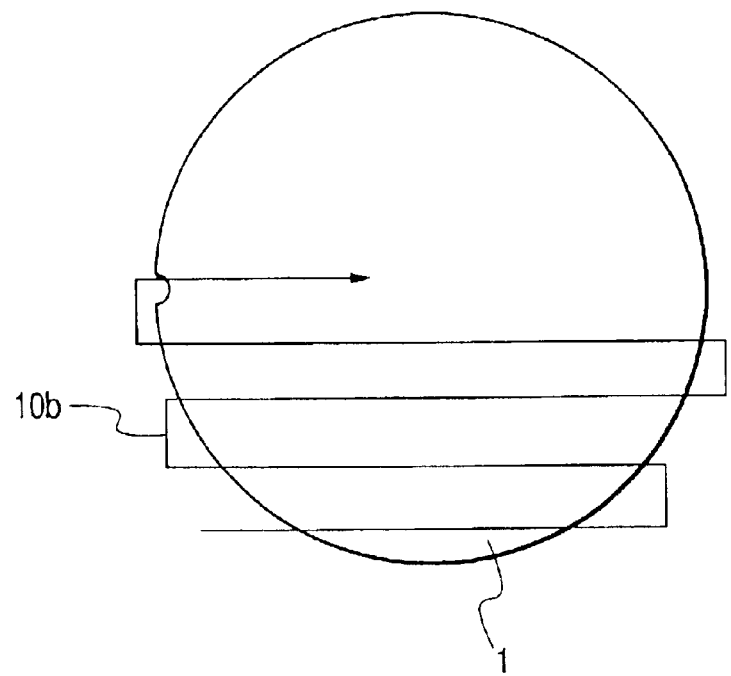

Naturally, since it is necessary to calculate also the amount of misalignment in the direction x, the wafer 1 is rotated by 90°, for example, by using the θ stage as shown in FIG. 20 like in the second embodiment, and the amount of misalignment in the direction x ($\Delta$x) is measured repetitively as described above. Although it is necessary to rotate the wafer 1 by 90°, it is possible to photograph the 1-dimensional images at a width of W of the alignment marks 3, 4 for each of the alignment mark portions (20–40 $\mu$m□) 6 in a state of running the X stage at a high speed of the about 100 mm/s, and they can be detected as image signals in the directions x and y from the alignment mark portions 6 at 120 to 240 positions per one sheet of wafer in about several minutes as image signals in the directions x and y.

Figure 23:
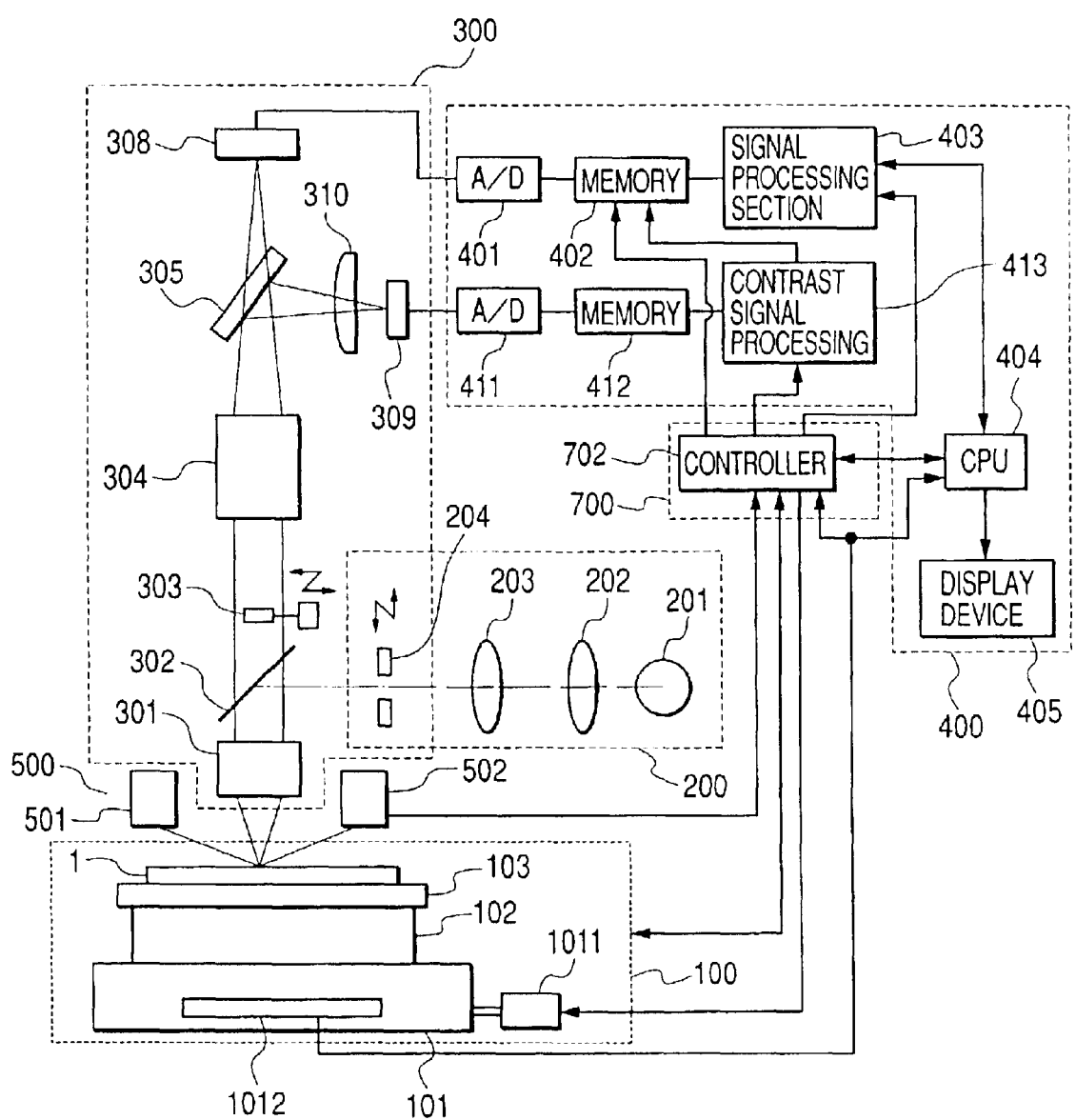
FIG. 23 is a constitutional view showing a fourth embodiment of an apparatus for measuring alignment accuracy according to this invention.

Then, a fourth embodiment of an apparatus for measuring alignment accuracy according to this invention is to be described. FIG. 23 is a view showing the constitution of a fourth embodiment of the apparatus for measuring alignment accuracy according to this invention. Different from the first, second and third embodiments, the fourth embodiment has no scanning optical system 306 and has a branching optical system 305 in the detection section 300, in which the 1-dimensional detector 309 detects focused images and the 2-dimensional detector 308 detects 2-dimensional images for the alignment mark portions 6 in a state of stopping the X stage.

The image processing section 400 further comprises an A/D converter 411 for A/D conversion of 1-dimensional focused image signals detected by the 1-dimensional detector 309, a memory 412 for storing the focused digital image signals obtained from the A/D converter 411, and a contrast signal processing section 413 for applying, for example, secondary differentiation to the focused digital image signals obtained from the memory 412 to calculate a contrast at which the secondary differentiation from both of the alignment marks reaches maximum, in which 2-dimensional image signals for the alignment mark portion 6 obtained from the 2-dimensional detector 308 when the contrast obtained in the contrast signal processing section 413 reaches the maximum is put to A/D conversion and taken into the memory 402.

That is, the XY stage 10 is caused to run drawing traces 10a and 10b as shown in FIGS. 6A and 6B and stopped at each of the alignment mark portions 6. Then, since an offset value for the automatic focusing is previously set to the controller 1 in accordance with the kind of the wafers to be mounted and the process steps, based on the images at 1 to 2 positions representing the wafer, it is controlled to a focused state based on the height information for the wafer detected from the automatic focus detection section 500. However, it is necessary to confirm whether the offset value set as described above is correct or not for all of the alignment mark portions formed in the wafer. Then, for several alignment mark portions 6, the Z stage is moved vertically at a predetermined step Δh in a state of interposing the optical source filter 204 and the focusing filter 303 and the 1-dimensional digital image signals shown in FIG. 24B are detected from the 1-dimensional detector 309 on every movement, which are A/D converted and stored in the memory 412. The contrast signal processing section 413 reads out the 1-dimensional digital image signals stored in the memory 412, calculates the contrast and stores the focused coordinate at which the calculated contrast reaches the maximum. Then, running of the X stage is stopped at each of the alignment mark portions 6 and, when the Z stage reaches the stored focused coordinate as described above, 2-dimensional optical images for each of the alignment mark portions 6 are photographed (imaged) by the 2-dimensional detector 308 to output 2-dimensional image signals which are converted into a 2-dimensional digital image signals by the A/D converter 401 and stored in the memory 402. As a result, the signal processing section 403 calculates the amount of misalignment for each of the mark portions 6 (Δx, Δy).

As has been explained above, according to the fourth embodiment, since focusing is controlled by using the same alignment mark used for the calculation of the misalignment amount for each of the alignment mark portions, 2-dimensional images of the alignment marks 3, 4 can be correctly imaged at a correct focused state to calculate the amount of misalignment at high accuracy.

The mode of controlling the exposure system by the apparatus for measuring alignment accuracy as has been described above is to be explained based on the vectors for the amount of misalignment calculated on every exposure unit 2 exposed on the wafer (decomposable into magnification ratio error component in the direction x and the direction y, rotational misalignment component, shift misalignment component in the direction x and the direction y, as well as other components).

Figure 25:
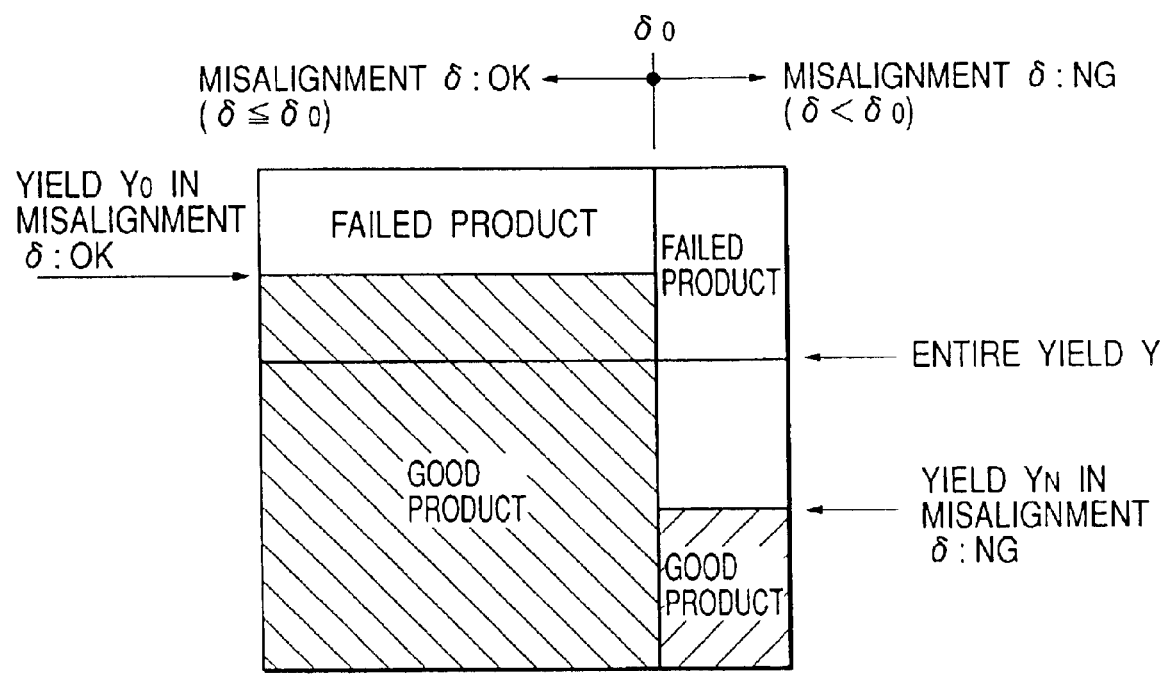
FIG. 25 is a view for explaining a relation for the yield $Y_O$ where the misalignment amount is OK, yield $Y_N$ where the misalignment amount is NG and the entire yield Y based on the relation between the good products and failed products of chip units or exposure units in a case where the misalignment amount $\delta$ is smaller than and greater than the aimed reference value $\delta_0$ according to this invention.

FIG. 25 is a view showing the relation between the number of good products and the number of failed products as a result of an operation test for IC chips (result of tester test) in a case where the length of the vector for the amount of misalignment satisfies an aimed misalignment reference value $\delta_0$ (indicated as OK) ($\delta \leq \delta_0$) and between the number of good products and the number of failed products as a result of an operation test for IC chips (result of tester test) in a case where the length of the vector for the amount of misalignment does not satisfy the aimed misalignment reference value $\delta_0$ (indicated as NG) ($\delta > \delta_0$) on every magnification ratio error component in the direction x and the direction y, rotational misalignment component, shift misalignment component in the direction x and the direction y, as well as other components measured and decomposed by the apparatus for measuring alignment accuracy in one or plurality sheets of wafers (may also be in lot unit) of identical kind and identical process steps. $Y_0$ represents the yield in a case where the length of the vector for misalignment satisfies the aimed misalignment reference value $\delta_0$ (OK), while $Y_N$ represents the yield in a case where the length of the vector for misalignment does not satisfy the aimed misalignment reference value $\delta_0$ (NG). Y represents the entire yield.

ΔY shown by the following equation (1) represents the degree of effect on the yield to the aimed misalignment difference value $\delta_0$ set as a control value for the misalignment amount δ on every components described above.

$$\Delta Y = Y - Y_0 \qquad (1)$$

Figure 26A:
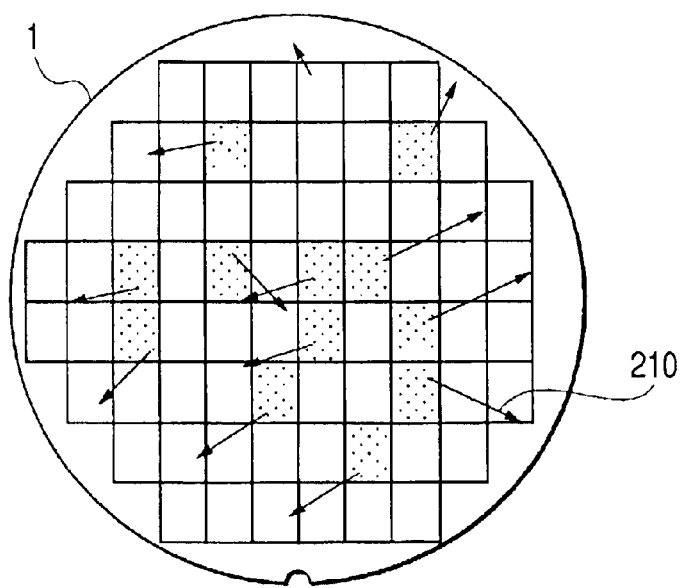
FIG. 26 is a view showing a relation between a vector in a case where the misalignment amount $\delta$ in a chip unit or an exposure unit is larger than the aimed misalignment reference value $\delta_0$ and the result of the operation test in this invention.
Figure 26B:
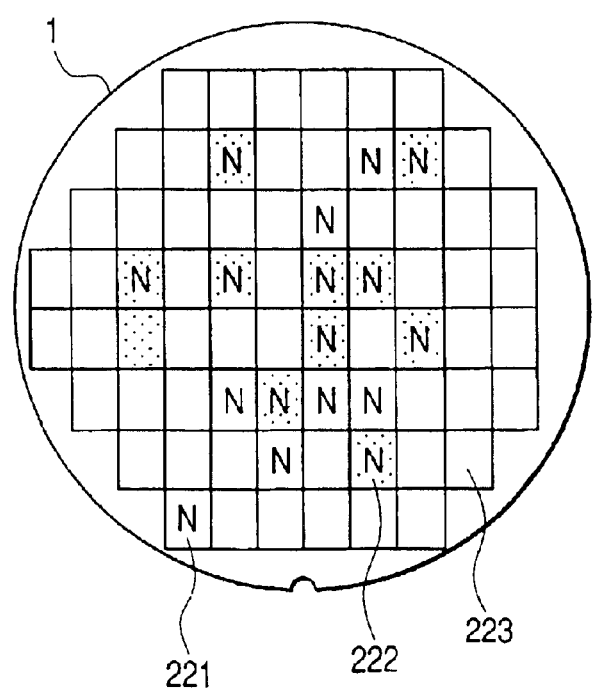

In FIGS. 26A and 26B, chip or exposure unit 2 in which the length of the misalignment vector δ on every components satisfies the aimed misalignment reference value $\delta_0$ as a blank area, while chip or exposure unit 2 not satisfying the reference value as a meshed area. FIG. 26B shows the good products with no symbol and failed products with N for the result of the operation test of IC chips (result of tester test).

Figure 27A:
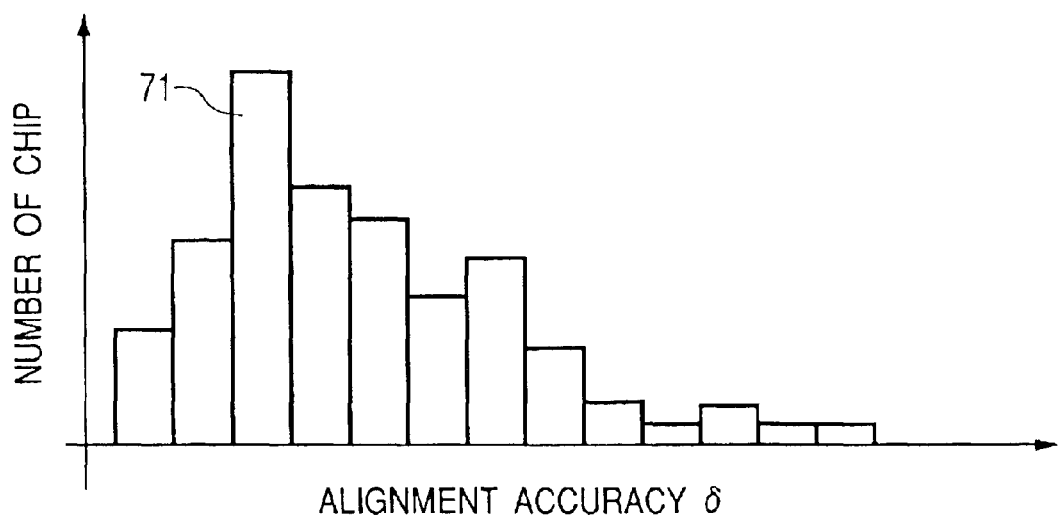
FIG. 27 is a graph showing a relation between the alignment accuracy $\delta$ and the number of chips or the number of exposure units, as well as a relation of the degree effect $\Delta Y$ on the yield to the aimed misalignment reference value $\delta_0$ in this invention.
Figure 27B:
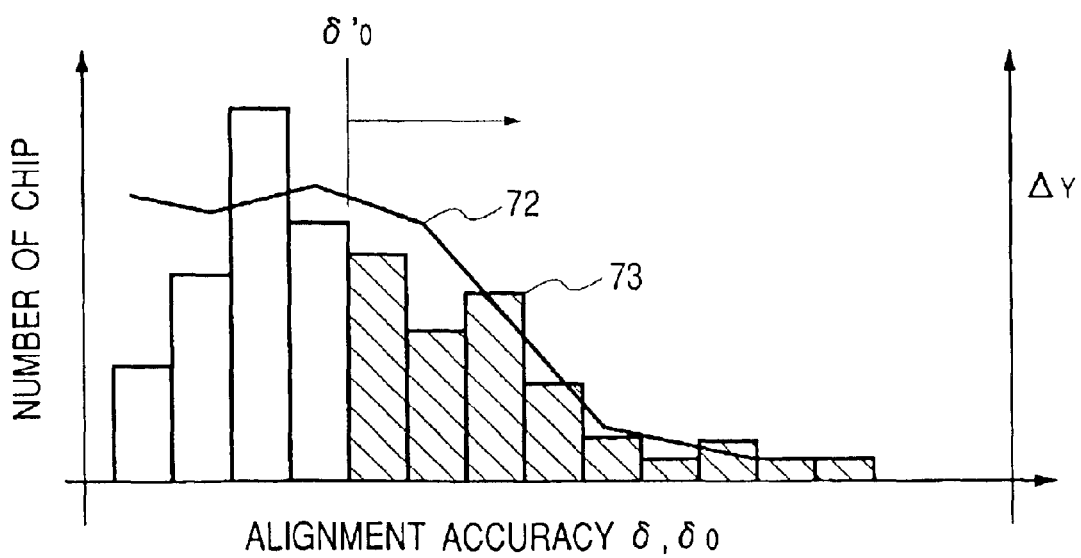
Figure 28:
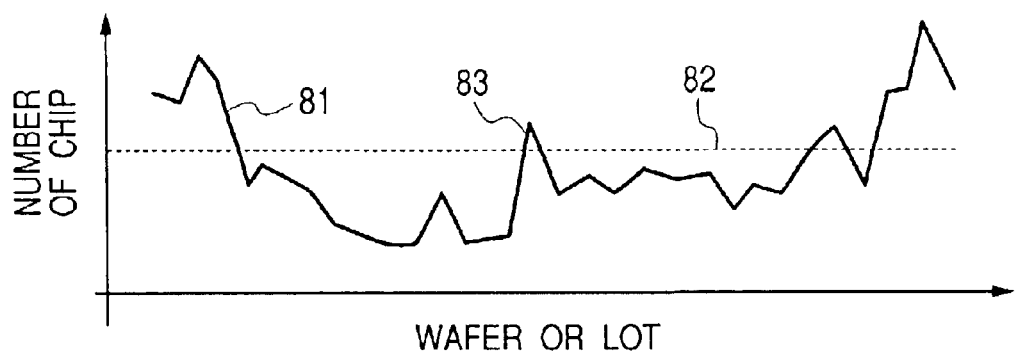
FIG. 28 is a graph showing the progress for the number of failed chips not satisfying the optimal aimed misalignment reference value $\delta_0$ on the wafer unit or lot unit in this invention.

FIG. 27 shows the number 71 of the chip or exposure units relative to the alignment accuracy δ in one or plurality sheet of wafers (may in lot unit) of an identical kind and from identical process steps. FIG. 27B is a graph showing a curve 72 for the degree of effect ΔY on the yield based on the equation (1) described above in a case where the aimed misalignment reference value $\delta_0$ as the control value is changed. The degree of effect ΔY 72 on the yield to the aimed misalignment reference value $\delta_0$ set as the control value for the misalignment amount δ on each of the components tends to decrease from a certain reference value $\delta_0'$ since the yield $Y_0$ in the chip unit or exposure unit in a case of increasing the aimed misalignment reference value $\delta_0$ ($\delta \leq \delta_0$) tends to increase in accordance with exceeding a certain reference value $\delta_0'$ from a substantially constant value in view of the relation (1) above. The probability of yielding failed products for chip unit or exposure unit where the misalignment amount δ does not satisfy the reference value $\delta_0'$ can be made maximum, by determining the reference value $\delta_0'$ at which the curve 72 for the degree of effect ΔY on the yield decreases from a substantially constant value.

Figure 29:
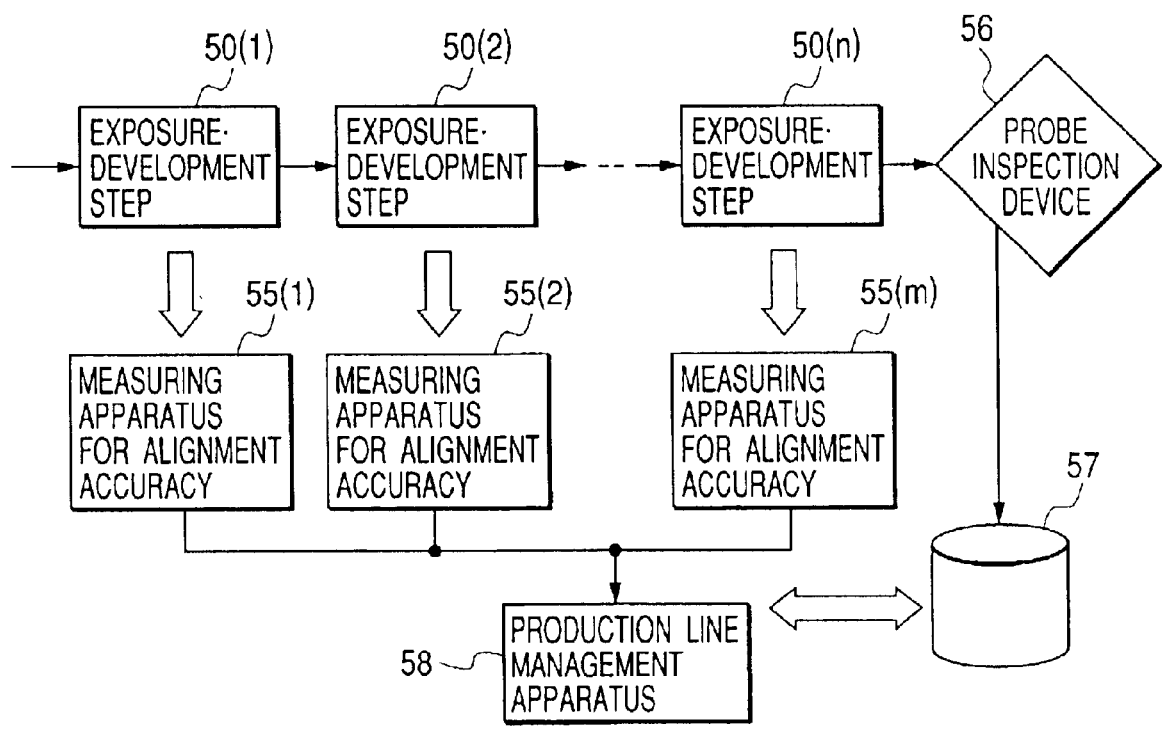
FIG. 29 is a view showing a schematic constitution of a production line according to this invention.

Then, the production line management device (the production line control device) 58 shown in FIG. 29 can set the allowable aimed misalignment reference value $\delta_0'$ on every components in view of the relation described above based on the result of the operation test for the IC chips inspected by a probe inspection device (tester) 56 and stored in a memory device 57, and the length of the vector δ on every magnification rate error component in the direction x and the direction y, rotational misalignment component, shifting misalignment component in the direction x and the direction y, as well as other components measured and decomposed by each of the apparatus for measuring alignment accuracy 55 (l)–55(m). As a result, it is necessary that the production line management device 58 calculates and controls the number of chips or number of exposure units 81 where the misalignment amount δ exceeds the aimed misalignment reference value $\delta_0'$ on every components, and conducts, for example, countermeasure of feed back to the production line and the projection aligner on wafer unit (also including lot unit), to decrease the amount of misalignment or to conduct exposure/development again when the control value 82 is exceeded. 50(l)–50(n) show different exposure/development steps. Naturally, the projection aligner is present on the exposure/development steps 50(l)–50(n).

Figure 30:
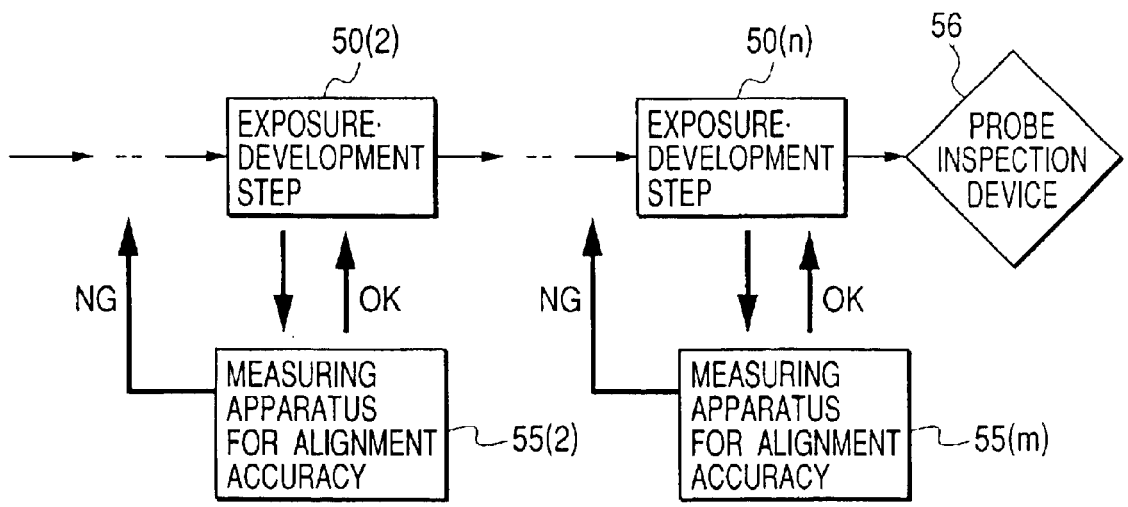
FIG. 30 is a view showing the flow of wafers in a case where wafers are OK and NG in an apparatus for measuring alignment accuracy according to this invention.

FIG. 30 is a view showing the flow of wafers in a case of calculating the number of chip or the number of exposure unit 81 on wafer unit or lot unit where the misalignment amount δ on every components measured and decomposed in each of the alignment accuracy measuring apparatus 55(l)–55(m) exceeds the aimed misalignment reference value $\delta_0{}'$ and in a case that the calculated number of chip satisfies the control value and does not satisfy the control value. That is, if the control value is satisfied, the wafer is proceeded to the succeeding step and if it does not satisfy, the resist formed on the wafer is removed and the wafer is returned to the resist coating step before the re-exposure/development step 50(j)–50(n) for conducting exposure/development again.

Figure 31:
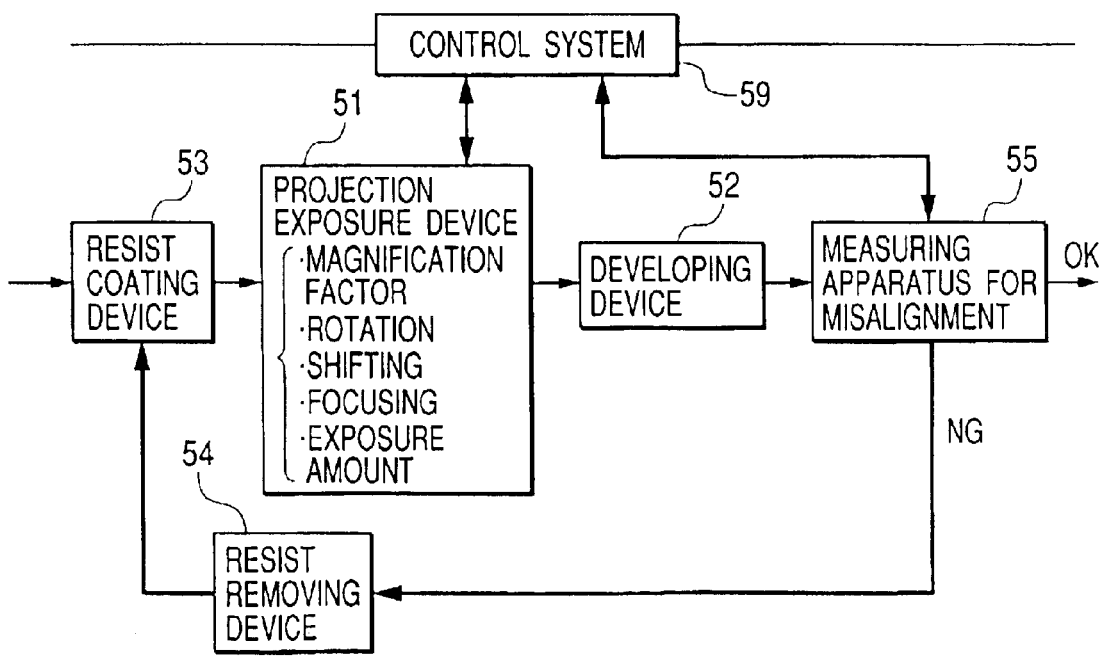
FIG. 31 is a view showing a constitution for a portion concerned with this invention in the production line.

FIG. 31 shows the flow of signal in addition to the flow of wafers. Information concerning the misalignment amount of each of the alignment mark portions 6 ($\Delta x$, $\Delta y$) for the wafer measured by the misalignment measuring apparatus 521, or concerning the misalignment amount $\delta$ on each chip unit or exposure unit is sent to control system 59 (which also may be a production line management device 58) and stored in the memory device (not illustrated). The control system 59 judges for OK and NG on the wafer unit or lot unit based on the misalignment amount stored in the memory device as described above and feeds back the information concerning the misalignment amount to the projection aligner 51 in a case of NG. The projection aligner 51 alters and corrects the offset value in the x and y directions of alignment in a case of the shift misalignment, conducts magnification ratio correction in a case of the magnification ratio misalignment (magnification ratio correction is conducted basically upon introduction of the projection aligner), and alters and corrects the offset value in the rotational direction of the alignment in a case of rotational misalignment. In addition, the projection aligner 51 can control also the focus error and the exposure amount. In summary, in a case where the misalignment amount exceeds an allowable range on wafer unit or lot unit, each of the offset values in the projection aligner 51 is corrected as described above. Numeral 52 denotes a developing device, 53 denotes a resist coating device and 54 denotes a resist removing device.

According to this invention, since alignment accuracy between exposed lower layer and upper layer can be measured without stopping the running of the stage, it can provided an effect capable of measuring the alignment accuracy of many alignment marks in a short period of time.

Further, according to this invention, since the alignment accuracy between the alignment marks of the lower layer and the alignment marks of the upper layer on the wafer can be measured at a higher speed, the distribution of the alignment accuracy in the wafer can be determined at a greater number of points, the accuracy for the analysis of the accuracy fluctuation factor due to the process can be improved

What is claimed is:

1. An apparatus for measuring alignment accuracy for measuring an alignment accuracy between alignment mark of the lower layer and alignment mark of the upper layer formed to each of alignment mark portions on every plural chip units or exposure units arranged on a substrate to be measured, comprising:

an XY stage running in a direction x and in a direction y while mounting the substrate;

an illumination optical system for illuminating the alignment mark portions in a state where the XY stage runs in a direction x which is a direction of arranging the chips;

a detecting optical system having an objective lens for collecting a reflection light in the running state obtained from the alignment mark of the lower layer and the alignment mark of the upper layer on each of the alignment mark portions irradiated by the illumination optical system, a focusing optical system for focusing reflection light in the running state obtained by collecting the reflection light from the objective lens, a scanning optical system for scanning reflection light image in the running state focused by the focusing optical system in a direction opposite to that of the running and a linear image sensor receiving reflection light image substantially in a static state being scanned in the opposite direction by the scanning optical system and converting them into image signal;, and an alignment accuracy calculation device for measuring alignment accuracy between the alignment mark of the lower layer and the alignment mark of the upper layer at least for a direction perpendicular to the running direction based on the image signal converted by the linear image sensor of the detecting optical system.

2. An apparatus for measuring alignment accuracy according to claim 1, wherein the linear image sensor of the detecting optical system comprises a 2-dimensional image sensor.

3. An apparatus for measuring alignment accuracy according to claim 1, wherein the linear image sensor of the detecting optical system comprises a TDI image sensor.

4. An apparatus for measuring alignment accuracy according to claim 1, wherein the linear image sensor of the detecting optical system comprises plural channels.

5. An apparatus for measuring alignment accuracy according to claim 1, wherein the illumination optical system is constituted for vertical illumination through the objective lens.

6. An apparatus for measuring alignment accuracy according to claim 1, wherein the illumination optical system has an optical source filter forming a secondary optical source.

7. An apparatus for measuring alignment accuracy according to claim 1, wherein the detecting optical system has a focusing filter for shutting or decreasing 0-order diffraction reflection light obtained from the alignment mark portions.

8. An apparatus for measuring alignment accuracy for measuring alignment accuracy between alignment mark of the lower layer and alignment mark of the upper layer formed to each of alignment mark portions on every plural chip units or exposure units arranged on a substrate to be measured, by at least two mode, comprising:

an XY stage running in a direction x and in a direction y while mounting the substrate;

an illumination optical system for illuminating a first alignment mark portion in a state where the XY stage runs in a direction x which is a direction of arranging the chips and for illuminating a second alignment mark portion in a static state;

a detecting optical system having an objective lens for collecting a first reflection light in the running state and a second reflection light in the static state obtained from alignment mark of the lower layer and alignment mark of the upper layer on each of the first and second alignment mark portions irradiated by the illumination optical system, a focusing optical system for focusing the first reflection light in the running state and the second reflection light in the static state obtained by collecting light from the objective lens, a switching optical system for switching the first reflection light in the running state and the second reflection light in the static state obtained by collecting light from the objective lens, a scanning optical system for scanning a first reflection light image in the running state being switched by the switching optical system and focused by the focusing optical system in a direction opposite to said scanning direction, a first linear image sensor receiving a first reflection light image substantially in a static state being scanned in the opposite direction by the scanning optical system and converting the same into first image signal, and a second linear image sensor for receiving a second reflection light image in the static state being switched by the switching optical system and focused by the focusing optical system and converting the same into second image signal; and a calculation device for alignment accuracy for measuring a first alignment accuracy between the alignment mark of the lower layer and the alignment mark of the upper layer on at least in a direction perpendicular to the running direction based on the first image signal converted by the first linear image sensor and measuring a second alignment accuracy between the alignment mark of the lower layer and the alignment mark of the upper layer based on the second image signals converted by the second linear image sensor.

9. An apparatus for measuring alignment accuracy according to claim 8, wherein the switching optical system in the detecting optical system is constituted with a branching optical system.

10. An apparatus for measuring alignment accuracy according to claim 8, wherein the switching optical system in the detecting optical system is constituted by advancing and retracting the scanning optical system in the detecting optical system.

11. An apparatus for measuring alignment accuracy according to claim 8, wherein the second linear image sensor in the detecting optical system comprises a 2-dimensional image sensor.

12. An apparatus for measuring alignment accuracy according to claim 8, wherein the first linear image sensor in the detecting optical system comprises a TDI image sensor.

13. An apparatus for measuring alignment accuracy according to claim 8, wherein the first linear image sensor in the detecting optical system comprises plural channels.

14. An apparatus for measuring alignment accuracy according to claim 8, wherein the illumination optical system is constituted for vertical illumination through the objective lens.

15. An apparatus for measuring alignment accuracy according to claim 8, wherein the illumination optical system has an optical source filter forming a secondary optical source.

16. An apparatus for measuring alignment accuracy according to claim 8, wherein the detecting optical system has a focusing filter for shutting or decreasing 0-order diffraction reflection light obtained from the aligned mark portions.

17. An apparatus for measuring alignment accuracy for measuring an alignment accuracy between alignment mark of the lower layer and alignment mark of the upper layer formed to each of alignment mark portions on every plural chip units or exposure units arranged on a substrate to be measured, comprising:

an XY stage running in a direction x and in a direction y while mounting the substrate;

an illumination optical system for illuminating the alignment mark portions;

a detecting optical system having an objective lens for collecting reflection light obtained from alignment mark of the lower layer and alignment mark of the upper layer on each of the alignment mark portions illuminated by the illumination optical system, a branching optical system for branching reflection light obtained by collection from the objective lens, a focusing optical system for focusing first and second reflection lights branched in the branching optical system, a 1-dimensional linear image sensor for receiving first reflection light image branched by the branching optical system and focused by the focusing optical system and converting the same into focus image signal, and a 2-dimensional linear image sensor for receiving a second reflection light image branched in the branching optical system and focused in the focusing optical system and converting the same into 2-dimensional image signal for detecting misalignment;

a focus control device for controlling the focused state of the substrate to be measured relative to the optical lens to an optimal state based on the focus image signal converted in the 1-dimensional linear sensor of the detecting optical system; and an accuracy calculation device for measuring the alignment accuracy between the alignment mark of the lower layer and the alignment mark of the upper layer based on the 2-dimensional image signal obtained from the 2-dimensional image sensor in the detecting optical system when the focused state is optimized by the focus control device.

18. A method for measuring alignment accuracy for measuring an alignment accuracy between alignment mark of the lower layer and alignment mark of the upper layer formed to each of alignment mark portions on every plural chip units or exposure units arranged on a substrate to be measured, comprising:

an illumination step of illuminating the alignment mark portion by an illumination optical system in a state where running the XY stage that runs in a direction x and in a direction y while mounting the substrate in a direction x which is a direction of arranging the chips;

a detection step of collecting a reflection light in the running state obtained from alignment mark of the lower layer and alignment mark of the upper layer on each of the illuminated alignment mark portions by an objective lens, focusing the reflection light in the running state obtained by collecting light by a focusing optical system, scanning focused reflection light image in the running state focused by a scanning system in a direction opposite to that of the running, and receiving the reflection light image substantially in a static state being scanned in the opposite direction by a linear image sensor and converting the same into image signals; and an alignment accuracy calculation step of measuring the alignment accuracy between the alignment mark of the lower layer and the alignment mark of the upper layer at least for a direction perpendicular to the running direction based on the image signals obtained from the linear image sensor.

19. A system for manufacturing semiconductor devices including:

an exposure/development device of coating a resist to a substrate to be measured, arranging circuit patterns also including alignment marks on the exposure units successively to the substrate coated with the resist, exposing the same, and then developing the substrate arranged and exposed the circuit patterns successively to remove the resist pattern;

an alignment accuracy measuring device for measuring alignment accuracy between mark of the lower layer and the mark of the upper layer formed to each of the alignment mark portions on every plural chip units or exposure units arranged on the substrate by the exposure/development device; and a control unit for calculating alignment accuracy decomposed into error components based on the alignment accuracy between the alignment mark of the lower layer and the alignment mark of the upper layer measured by the alignment accuracy measuring device on substrate units or lot units, setting an alignment accuracy reference value on every error components at which degree of effect on yield is started to be decreased on the substrate units or the lot units, and controlling alignment accuracy to the exposure/development device by the progress of number for chip units or number for the exposure units in which the calculated alignment accuracy on every error components exceeds the alignment accuracy reference value set on every error components.

20. A method for manufacturing semiconductor devices comprising:

an exposure/development step of coating a resist to a substrate to be measured, successively arranging and exposing circuit patterns also including alignment mark on exposure units to the substrate coated with the resist and developing the substrate which have been arranged and exposed the circuit patterns successively to remove the resist pattern;

an alignment accuracy measuring step of measuring the alignment accuracy on every plural chip units or exposure units arranged on the substrate by the exposure/development step between the alignment mark of the lower layer and the alignment mark of the upper layer formed to each of alignment mark portions, and a control step of calculating alignment accuracy decomposed into error components based on the alignment accuracy between the alignment mark of the lower layer and the alignment mark of the upper layer measured by the alignment accuracy measuring step, setting an alignment accuracy reference value on every error components at which degree of effect on yield is started to be decreased on substrate units or lot units, and controlling alignment accuracy to the exposure/development device depending on the progress of number for chip units or number for exposure units in which the calculated alignment accuracy on every error components exceeds the alignment accuracy reference value on every error components.

21. A method for manufacturing semiconductor devices according to claim 20, wherein the degree of effect on the yield in the control step is calculated based on result of checking judgment in an operation test on the chip units or on the exposure units.

* * * * *